(12) United States Patent
Kim et al.

(10) Patent No.: US 8,816,407 B2
(45) Date of Patent: Aug. 26, 2014

(54) SEMICONDUCTOR PACKAGE

(71) Applicant: Samsung Electronics Co., Ltd., Suwon-si (KR)

(72) Inventors: Jong-yeon Kim, Suwon-si (KR); Tae-hong Min, Yongin-si (KR); Yeong-kwon Ko, Seoul (KR); Tae-je Cho, Hwaseong-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/765,696

(22) Filed: Feb. 13, 2013

(65) Prior Publication Data

US 2013/0221493 A1     Aug. 29, 2013

(30) Foreign Application Priority Data

Feb. 28, 2012 (KR) .................. 10-2012-0020402

(51) Int. Cl.
*H01L 23/48* (2006.01)
*H01L 23/31* (2006.01)

(52) U.S. Cl.
CPC ..... *H01L 23/481* (2013.01); *H01L 2924/15311* (2013.01); *H01L 23/3128* (2013.01); *H01L 23/3135* (2013.01); *H01L 2224/16225* (2013.01)
USPC ........................ 257/260; 257/621; 257/770

(58) Field of Classification Search
USPC .................................... 257/620–621
See application file for complete search history.

(56) References Cited

U.S. PATENT DOCUMENTS

| | | | |
|---|---|---|---|
| 5,654,582 | A | 8/1997 | Kijima et al. |
| 6,159,826 | A | 12/2000 | Kim et al. |
| 6,379,982 | B1 | 4/2002 | Ahn et al. |
| 6,953,748 | B2 | 10/2005 | Yamaguchi |
| 7,276,799 | B2 | 10/2007 | Lee et al. |
| 2001/0045663 | A1 | 11/2001 | Edura et al. |
| 2007/0243666 | A1 | 10/2007 | Huang et al. |
| 2010/0224977 | A1* | 9/2010 | Kim .............................. 257/686 |

FOREIGN PATENT DOCUMENTS

| | | |
|---|---|---|
| JP | 2007-134427 | 5/2007 |
| KR | 10-2000-0022722 A | 4/2000 |
| KR | 10-2003-0055834 A | 7/2003 |

* cited by examiner

*Primary Examiner* — Mamadou Diallo
(74) *Attorney, Agent, or Firm* — Muir, Patent Consulting, PLLC

(57) ABSTRACT

Semiconductor packages are disclosed. A semiconductor package includes: a first chip that includes a chip region and scribe regions at edges of the chip region, wherein the chip region comprises integrated circuit units and main through substrate vias electrically connected to the integrated circuit units; and a second chip that is bonded onto the first chip. The semiconductor package includes dummy conductive connectors including at least dummy wiring lines, the dummy conductive connectors electrically connected to the main through substrate vias at one end, and not capable of forming an electrical connection at the other end.

20 Claims, 21 Drawing Sheets

SEMICONDUCTOR PACKAGE

CROSS-REFERENCE TO RELATED APPLICATIONS

This application claims the benefit of Korean Patent Application No. 10-2012-0020402, filed on Feb. 28, 2012, in the Korean Intellectual Property Office, the disclosure of which is incorporated herein in its entirety by reference.

BACKGROUND

The present disclosure relates to a semiconductor package, and more particularly, to a semiconductor package in which a plurality of chips are stacked.

Because of the miniaturization and increased processing speed of semiconductor devices, a semiconductor package in which a plurality of chips are stacked is proposed. Also, there is a desire to increase a reliability of the semiconductor package in which a plurality of chips are stacked.

SUMMARY

The present disclosure provides a semiconductor package having high reliability.

According to one embodiment, a semiconductor package includes: a first chip that includes a chip region and scribe regions at edges of the chip region, wherein the chip region comprises integrated circuit units and main through substrate vias electrically connected to the integrated circuit units; and a second chip that is bonded onto the first chip. The semiconductor package includes dummy conductive connectors including at least dummy wiring lines, the dummy conductive connectors electrically connected to the main through substrate vias at one end, and not capable of forming an electrical connection at the other end.

The dummy wiring lines may extend from the chip region of the first chip to the scribe regions.

The dummy wiring lines may be surrounded by an intermetallic insulating layer in the first chip.

The first chip and the second chip may be electrically connected through the main through substrate vias.

In one embodiment, the dummy wiring lines terminate at side surfaces of the first chip.

In another embodiment, the dummy conductive connectors further comprise dummy through substrate vias formed in the scribe regions of the first chip. Each dummy through substrate via may be electrically connected to a main through substrate via through one of the dummy wiring lines.

Test pads may be formed in the scribe regions in the first chip and be electrically connected to the dummy through substrate vias. In addition, a molding member may cover the test pads and side surfaces of the second chip. Prior to the formation of the molding member, the test pads may be configured to perform an electrical die sorting (EDS) test for detecting whether the connection between the second chip and the main through substrate vias is favorable or not.

In another embodiment, a semiconductor package includes: a first chip that comprises through substrate vias connected to circuitry in the first chip, and first connection members that are electrically connected to the through substrate vias; a second chip that is stacked on the first chip and comprises second connection members that are electrically connected to the through substrate vias; and a sealing member that seals side surfaces of the first and second chip not to be exposed. The first chip comprises dummy wiring lines that terminate at the side surfaces of the first chip and are electrically connected to the through substrate vias.

The first chip may include: a substrate having a first surface and a second surface; a plurality of integrated circuit units on the first surface of the substrate; an insulating interlayer that covers the integrated circuit units; a plurality of multi-layer wiring patterns that are formed on the insulating interlayer and are connected to the main through substrate vias; and a lower insulating layer that covers the multi-layer wiring patterns. In one embodiment, the first connection members are formed on the lower insulating layer and are electrically connected to the multi-layer wiring patterns, and the dummy wiring lines are formed on the insulating interlayer.

In a further embodiment, a semiconductor package includes: a first chip including through substrate vias electrically connected to circuitry within the first chip; first external connection terminals electrically connected to the through substrate vias, respectively; a second chip stacked on the first chip, the second chip including connection terminals electrically connected to the through substrate vias of the first chip; and a dummy conductive connector including at least a dummy wiring line, the dummy conductive connector including a first end electrically connected to the circuitry within the first chip and a second end left floating.

An insulative capping layer may cover and contact the dummy conductive connector.

In one embodiment, the dummy conductive connector includes only the dummy wiring line. The dummy wiring line may terminate at the same plane as a first side of the first chip. The dummy wiring line may connect to an insulative capping layer.

In another embodiment, the dummy conductive connector includes the dummy wiring line and at least a through substrate via electrically connected to the dummy wiring line. The through substrate via may be located in a scribe region of the first chip. The dummy conductive connector may further include a dummy pad disposed on the through substrate via, the dummy pad contacting an insulative capping layer disposed around the second chip.

BRIEF DESCRIPTION OF THE DRAWINGS

Exemplary embodiments will be more clearly understood from the following detailed description taken in conjunction with the accompanying drawings in which.

DETAILED DESCRIPTION

Figure 1:
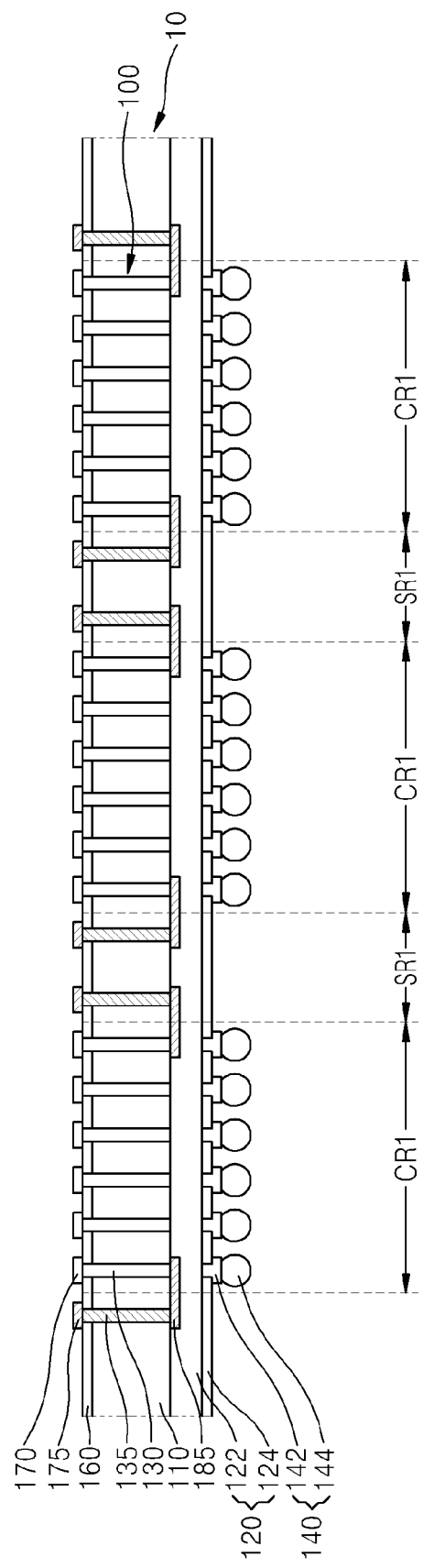
FIGS. 1 through 8 are cross-sectional views for describing a method of manufacturing semiconductor packages, according to an exemplary embodiment.

The present disclosure now will be described more fully hereinafter with reference to the accompanying drawings, in which various embodiments are shown. The invention may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. Unless indicated otherwise, these terms are only used to distinguish one element from another. For example, a first chip could be termed a second chip, and, similarly, a second chip could be termed a first chip without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures have schematic properties, and shapes of regions shown in figures exemplify specific shapes of regions of elements, and the specific properties and shapes do not limit aspects of the invention.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIGS. 1 through 8 are cross-sectional views for describing a method of manufacturing semiconductor packages 1000 (see FIG. 8), according to an exemplary embodiment. In FIGS. 1 through 8, like reference numerals are used to denote identical elements.

Referring to FIG. 1, a base wafer 10 that includes a plurality of first chips 100 is prepared. The base wafer 10 is divided into a plurality of chip regions CR1 and scribe regions SR1 around the chip regions CR1. The base wafer 10 includes the first chips 100 formed in each of the chip regions CR1. In FIG. 1, for convenience, three chip regions CR1 are formed in the base wafer 10. However, a few tens to a few hundreds of the first chips 100 may be formed in the base wafer 10. Chips 100 may be semiconductor chips, such as, for example, memory chips or logic chips.

In one embodiment, the base wafer 10 includes a body layer 110, a lower insulating layer 120, main through substrate vias (e.g., through silicon vias (TSVs)) 130, dummy through substrate vias (e.g., TSVs) 135, first connection members 140, a protection layer 160, upper pads 170, test pads 175, and dummy wiring lines 185.

The body layer 110 may include, for example, a substrate (not shown), an integrated circuit unit (not shown) formed on the substrate, and an insulating interlayer (not shown).

The lower insulating layer 120 may be formed on the bottom of the body layer 110 and may include, for example, an intermetallic insulating layer 122 and a passivation layer 124. A multi-layer wiring pattern (not shown) may be formed in the intermetallic insulating layer 122.

A plurality of main TSVs 130 may be formed in the chip regions CR1, and may be connected to the multi-layer pattern of the lower insulating layer 120 through the body layer 110. As such, each of the main TSVs 130 may electrically connect to active circuitry within the semiconductor chip 100. The method of forming the main TSVs 130 will be described below.

Each of the first connection members 140 may include, for example, a bump pad 142 and a bump 144. The bump pad 142 may be formed of a conductive material on the passivation layer 124, and may be electrically connected to the multi-layer pattern of the lower insulating layer 120. Accordingly, the bump pad 142 may be electrically connected to the main TSV 130 through the multi-layer pattern of the lower insulating layer 120. An under bump metal (UBM) (not shown) may be formed on the bump pad 142. The bump pad 142 may be formed, for example, of Al or Cu by using a pulse plating method or a direct current plating method. However, the method and material for forming the bump pad 142 according to the disclosed embodiments are not limited thereto. The bump 144 may be formed on the bump pad 142. The bump 144 may be formed of a conductive material, for example, Cu, Al, Au, or solder. However, the material for forming the bump 144 according to the inventive concept is not limited thereto. If the bump 144 is formed of solder, the bump 144 may be referred to as a solder bump. Bump pad 142 and bump 144 are also referred to collectively as external connection terminals. The external connection terminals can be used to electrically connect the chip 100 to a device outside the chip.

The protection layer 160 may be formed on the body layer 110 using an insulating material to protect the body layer 110 from the outside. The protection layer 160 may be formed, for example, of an oxide, a nitride, or a combination of these materials. For example, the protection layer 160 may be formed of a silicon oxide ($SiO_2$) film by using a chemical vapor deposition (CVD) process.

The upper pads 170 may be formed in plural on the protection layer 160 in the chip regions CR1, and may be electrically and physically connected to the main TSVs 130, respectively. The upper pads 170 may be formed, for example, of Al or Cu, like the bump pads 142.

A plurality of dummy TSVs 135 may be formed in the scribe regions SR1 and pass through the body layer 110. The dummy TSVs 135 may be formed in a shape similar to the main TSVs 130. In FIG. 1, as an example, two dummy TSVs 135 are formed in each of the scribe regions SR1. However, the number of dummy TSVs 135 may vary, for example, according to a width of the scribe region SR1.

The dummy wiring lines 185 are connected from the chip regions CR1 to the scribe regions SR1 in the lower insulating layer 120. The main TSVs 130 and the dummy TSVs 135 may be electrically connected by the dummy wiring lines 185. In FIG. 1, it is depicted that two dummy wiring lines 185 are formed to respectively connect the two dummy TSVs 135 in the scribe regions SR1 to the main TSVs 130 disposed in the chip regions CR1 on both sides of the scribe regions SR1. Also, the number of dummy wiring lines 185 may vary according to the number of dummy TSVs 135.

The test pads 175 may be formed on the protection layer 160 in the scribe regions SR1 and may be electrically connected to the dummy TSVs 135, respectively. The test pads 175 may be formed, for example, of Al or Cu, like the upper pads 170. The test pads 175 may have a width equal to or greater than that of the upper pads 170. Also, the test pads 175 may have a width smaller than that of the scribe regions SR1. In FIG. 1, two test pads 175 are formed in each of the scribe regions SR1. However, the number of test pads 175 may vary according to the number of dummy TSVs 135.

In general, dummy conductive connectors may be connected to the main through substrate vias to allow for testing. As described above, an example of a dummy conductive connector includes the combination of a dummy wiring line, dummy through substrate via, and dummy test pad. In one embodiment, at least part of the dummy conductive connectors are located in scribe regions of the chip 100. For example, the scribe region may be a region where no logic circuitry is present in the chip 100. In certain embodiments, the scribe region includes an outer portion of the chip for which a cutting singulation operation can be performed without affecting the operation of the logic circuitry used by the chip 100.

The base wafer 10 will be described in more detail below.

Figure 2:
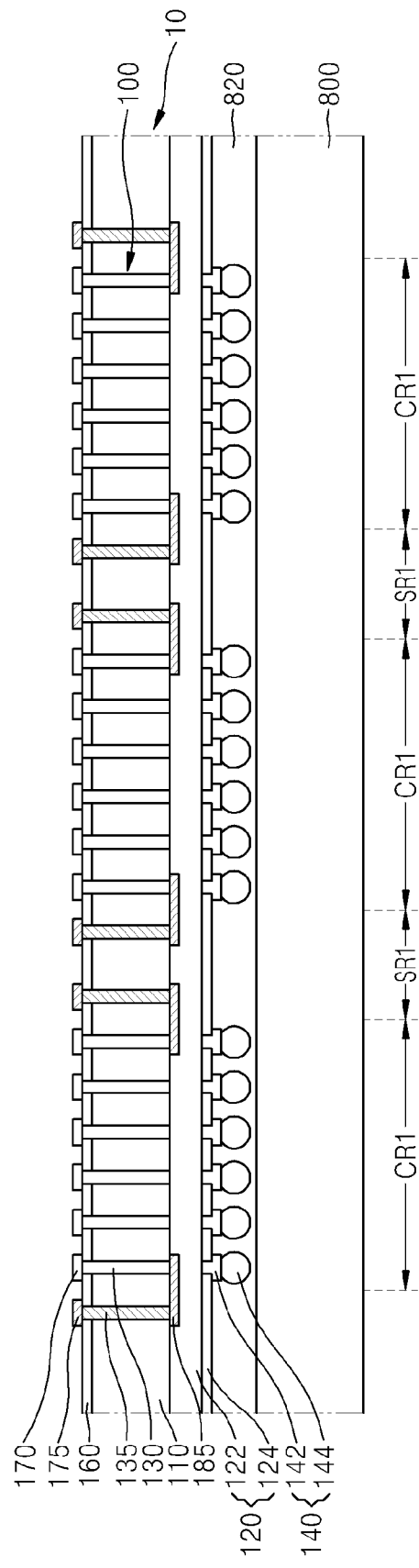

Referring to FIG. 2, a supporting carrier 800 is prepared. An adhesive member 820 may be formed on the supporting carrier 800. The supporting carrier 800 may be formed of a material selected, for example, from the group consisting of silicon, germanium, silicon-germanium, gallium-arsenic (GaAs), glass, plastic, and ceramic. The adhesive member 820 may be formed, for example, of a material selected from the group consisting of a non-conductive film (NCF), an anisotropic conductive film (ACF), a UV sensitive film, an instant adhesive, a thermosetting adhesive, a laser hardening adhesive, an ultrasonic hardening adhesive, and a non-conductive paste (NCP).

The base wafer 10 is bonded to the supporting carrier 800 by the adhesive member 820. The first connection members 140 of the base wafer 10 may be bonded toward the supporting carrier 800. The supporting carrier 800 may be prepared before preparing the base wafer 10 or, after preparing the base wafer 10, before the supporting carrier 800 is bonded to the base wafer 10.

Figure 3:
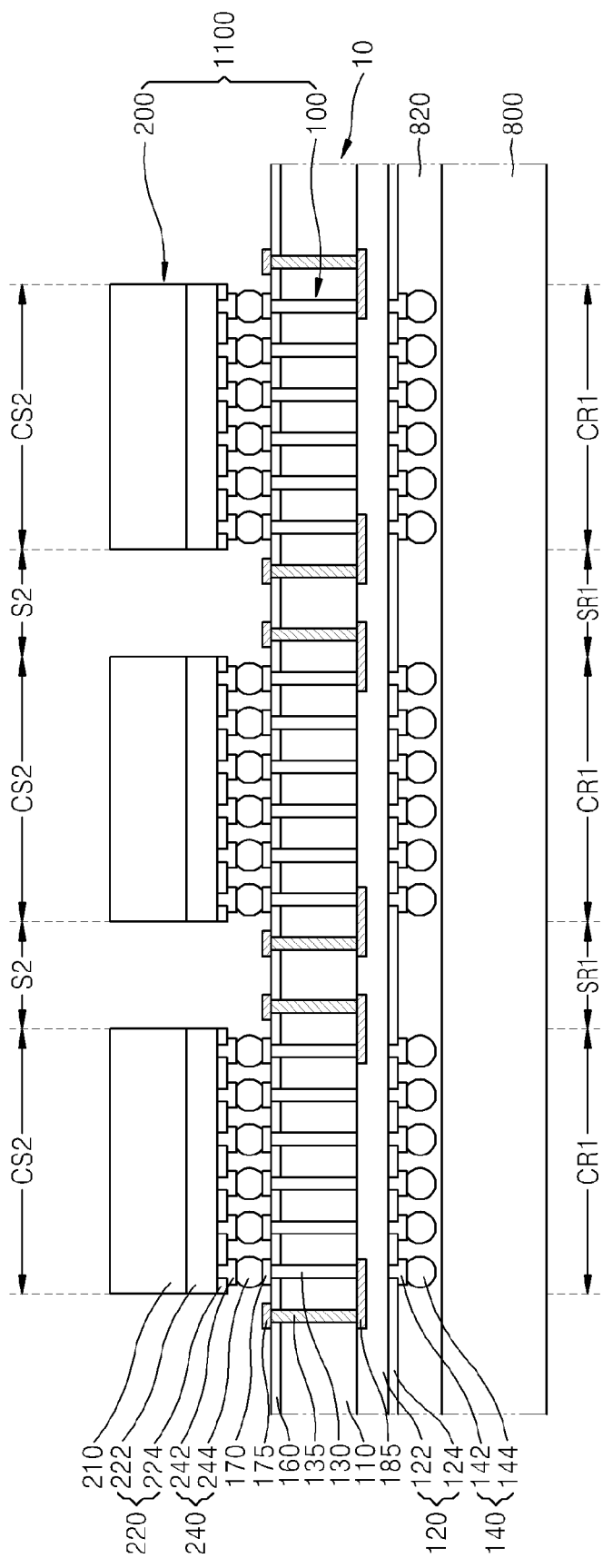

Referring to FIG. 3, second chips 200 are prepared. Chips 200 may be semiconductor chips, such as, for example, memory chips or logic chips. Each of the second chips 200 may include a body layer 210, a lower insulating layer 220, and second connection members 240. The body layer 210, like the first chip 100, may include a substrate (not shown), an integrated circuit unit (not shown) formed on the substrate, and an insulating interlayer (not shown). An upper surface of the body layer 210 may be exposed to the outside. The integrated circuit unit may be formed on a first surface of the substrate, and a second surface of the substrate opposed to the first surface may be an upper surface of the body layer 210. For example, if the substrate of the second chip 200 is a silicon substrate, an upper surface of the silicon substrate may be exposed to the outside. Although not shown, a protection layer may further be formed on the body layer 210, and in this case, the upper surface of the silicon substrate may not be directly exposed to the outside.

The lower insulating layer 220 may be formed on a lower surface of the body layer 210, and may include an intermetallic insulating layer 222 and a passivation layer 224. A multi-layer pattern (not shown) may be formed in the intermetallic insulating layer 222.

Each of the second connection members 240 may be formed on the passivation layer 224 and the lower insulating layer 220, may include a bump pad 242 and a bump 244. The second connection members 240 may be external connection terminals for connecting the second chip 200 to an external device (e.g., such as the first chip 100). The bump pad 242 is formed on the passivation layer 224 using a conductive material, and may be electrically connected to the multi-layer pattern of the lower insulating layer 220. A UBM (not shown) may be formed on the bump pad 242. In certain embodiments, the bump pad 242 may be formed of the same material and the same method used to form the bump pad 142 of the first connection member 140. The bump 244 may be formed on the bump pad 242. The bump 244, like the bump 144 of the first connection member 140, may be formed of a conductive material selected, for example, from the group consisting of Cu, Al, Au, and solder, but is not limited thereto. In one embodiment, the second chip 200, unlike the first chip 100, may not have TSVs that pass through the body layer 210. Accordingly, upper pads may not be formed.

A stacked chip 1100 is formed by stacking the second chip 200 on the first chip 100. The stacking operation may be performed, for example, by thermo-compression bonding the second connection member 240 of the second chip 200 onto the upper pad 170 of the first chip 100. Accordingly, the second connection member 240 may be connected to the upper pad 170 of the first chip 100. The multi-layer pattern of the second chip 200 may be electrically connected to the main TSVs 130 of the first chip 100 through the second connection members 240.

Since the second connection member 240 of the second chip 200 is disposed corresponding to the location of the upper pad 170 of the first chip 100, the second chip 200 may be disposed on the first chip 100. Accordingly, the second chip 200 may be of the same kind as or a different kind than the first chip 100. For example, the second chip 200 may be a chip formed by separating a base wafer, such as the base wafer 10 of FIG. 1, and in this case, a TSV (not shown) that passes through the body layer 210 may further be formed like in the first chip 100.

In FIG. 3, as an example, the second chip 200 has a width CS2 that is substantially the same as that of the chip region CR1. In this case, a gap S2 between the second chips 200 may be substantially the same as a width of the scribe region SR1. Alternatively, the width CS2 of the second chip 200 may be smaller than the width of the chip region CR1 of the base wafer 10, and in this case, the gap S2 between the second chips 200 may be greater than the width of the scribe region SR1.

Next, an electrical die sorting (EDS) test may be performed through the test pads 175. Typically, first and second stacked chips have the same size, or in some situations, the second chip has a slightly smaller size than that of the first chip. Therefore, a connection failure of stacked chips may not be easily detected. According to certain embodiments, however, since an upper surface of the test pad 175 formed in the scribe region SR1 is not covered by the second chip 200, the electrical connections are detected and whether they are connected properly or not is determined through the exposed upper surface of the test pad 175. The second chip 200 is connected to the upper pad 170 through the second connection member 240, and the upper pad 170 is connected to the main TSV 130. The test pad 175 is connected to the main TSV 130 in the chip region CR1 through the dummy TSV 135 and the dummy wiring line 185 formed in the scribe region SR1. Accordingly, stacked chips having connection failures may be sorted by performing an EDS test onto the test pad 175. The EDS test may be performed by using, for example, a probe card (not shown). For example, the EDS test may be performed by contacting a terminal pin (not shown) of the probe card with the test pad 175 to apply an electrical signal to the test pad 175.

Figure 4:
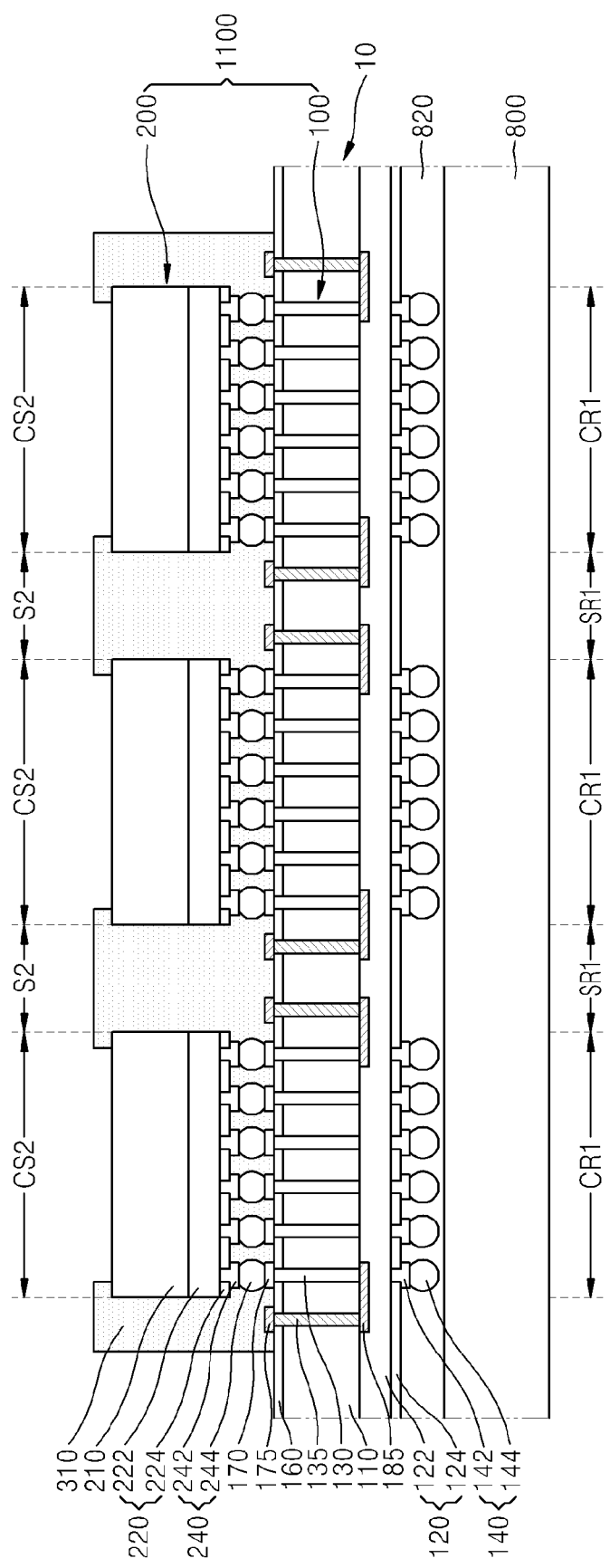

Referring to FIG. 4, an underfill 310 that fills connection portions between the first chips 100 and the second chips 200 may be formed. The underfill 310 may fill a connection portion between the first chip 100 and the second chip 200, for example, a portion where the upper pad 170 of the first chip 100 is connected to the second connection member 240. The underfill 310 may be formed of an insulating material, for example, an underfill resin such as an epoxy resin, and may include silica filler or flux. The underfill 310 may be formed of a material different from or the same material used to form a molding member 320 (refer to FIG. 5) in a subsequent process.

As depicted in FIG. 4, the underfill 310 may not only fill the connection portion but also may seal side surfaces of the second chip 200 and a portion of an upper surface of the second chip 200. As such, in one embodiment, the underfill 310 may only fill the connection portion between the first chip 100 and the second chip 200, but, as depicted in FIG. 4, in other embodiments, the underfill 310 may also be formed to surround the side surfaces of the second chip 200 while filling the connection portions between the first chip 100 and the second chip 200. The underfill 310 may be formed to overlap with the underfill 310 on a lower part of the adjacent second chip 200. In this way, when the underfill 310 surrounds the side surfaces of the second chip 200, the underfill 310 may be exposed at the side surfaces of the second chip 200 when a semiconductor package is completed.

Figure 5:
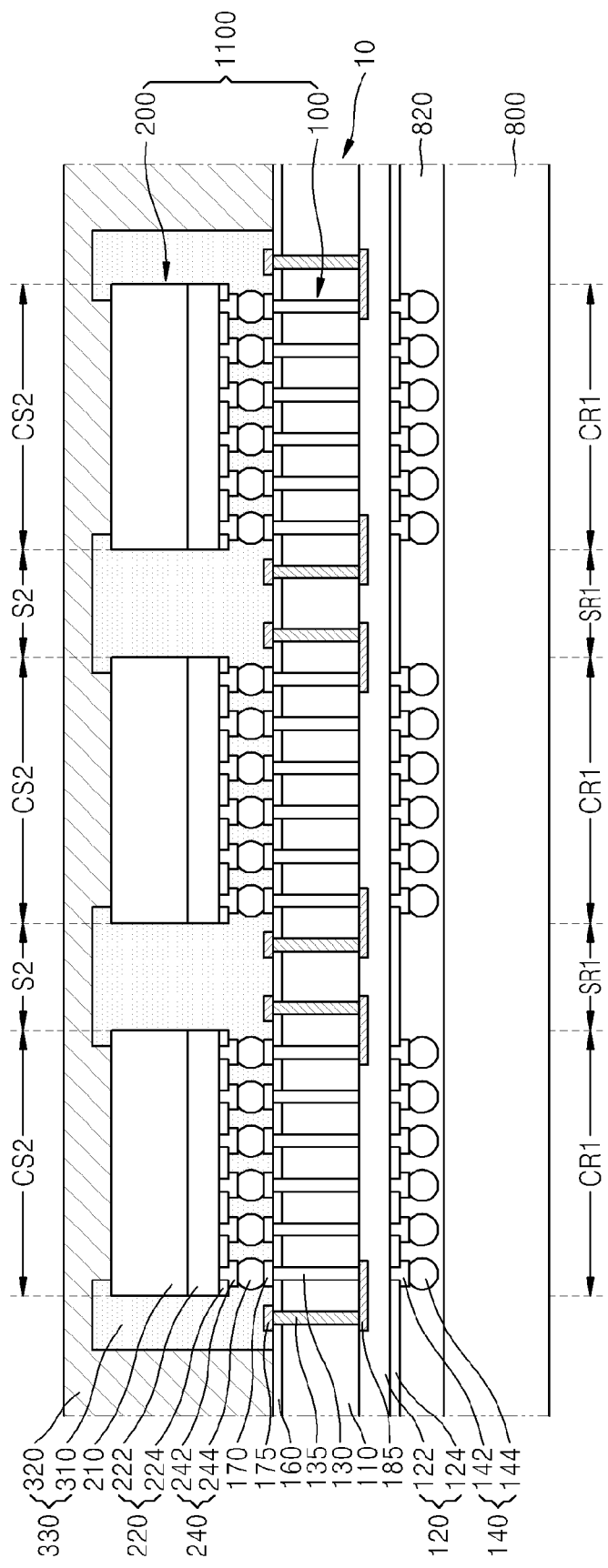

Referring to FIG. 5, the molding member 320 that molds the stacked chips 1100 bonded on the supporting carrier 800 may be formed. The molding member 320 may be formed of an insulating material, such as, for example, a polymer such as resin. For example, the molding member 320 may be formed of an epoxy molding compound (EMC). The underfill 310 and the molding member 320 may be referred to as a sealing member 330. The sealing member 330 may seal side and upper surfaces of the first and second chips 100 and 200 of the stacked chips 1100. Due to the underfill 310, the molding member 320 may seal side surfaces of the underfill 310.

Figure 6:
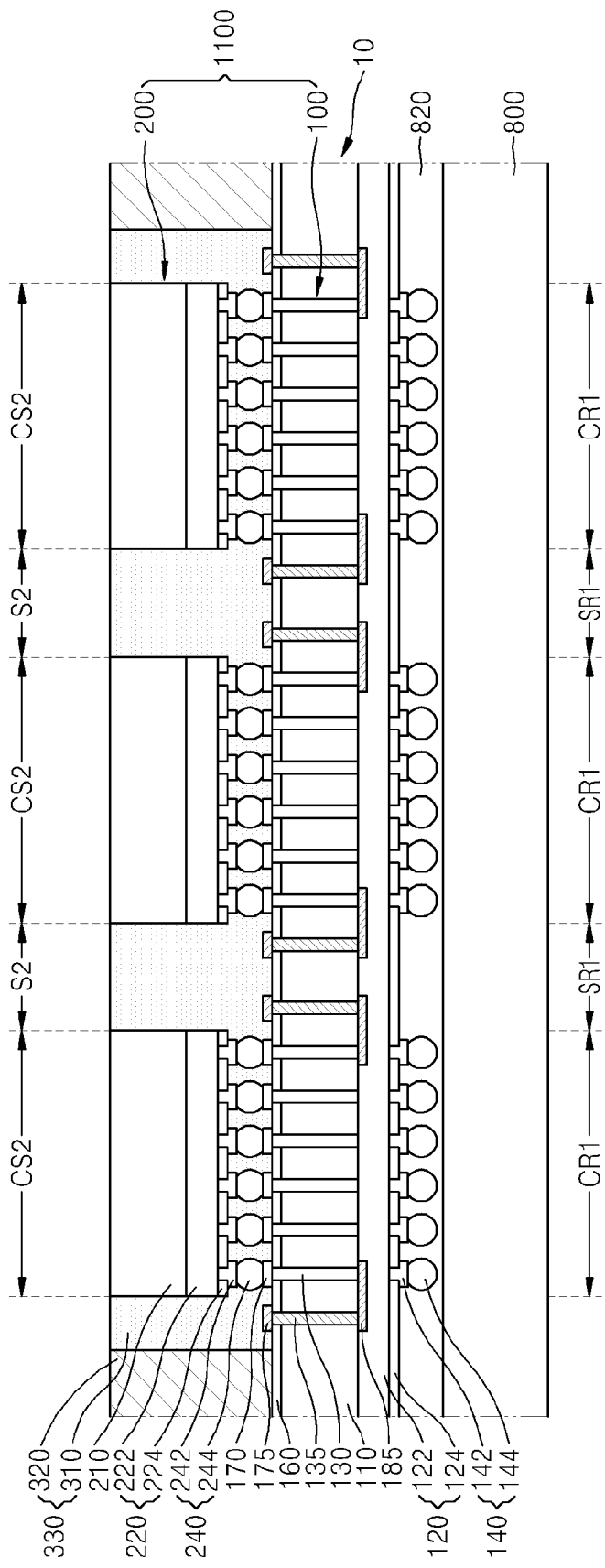

Referring to FIG. 6, upper surfaces of the second chips 200 of the stacked chips 1100 may be exposed by grinding an upper surface of the sealing member 330. The upper surface of the sealing member 330 may be flush with the upper surface of the second chip 200. If TSVs are not formed in the second chip 200, the upper surface of the second chip 200 may be a second surface of a semiconductor substrate (for example, a silicon substrate) on which the integrated circuit is not formed. Accordingly, silicon of the second surface of the semiconductor substrate may be exposed to the outside.

When the stacked chip 1100, for example, the upper surface of the second chip 200, is exposed by grinding the upper surface of the sealing member 330, it may be easier to mount and mold a semiconductor package 1000 (refer to FIG. 8) that is completed in a subsequent process on a board substrate (not shown).

Figure 7:
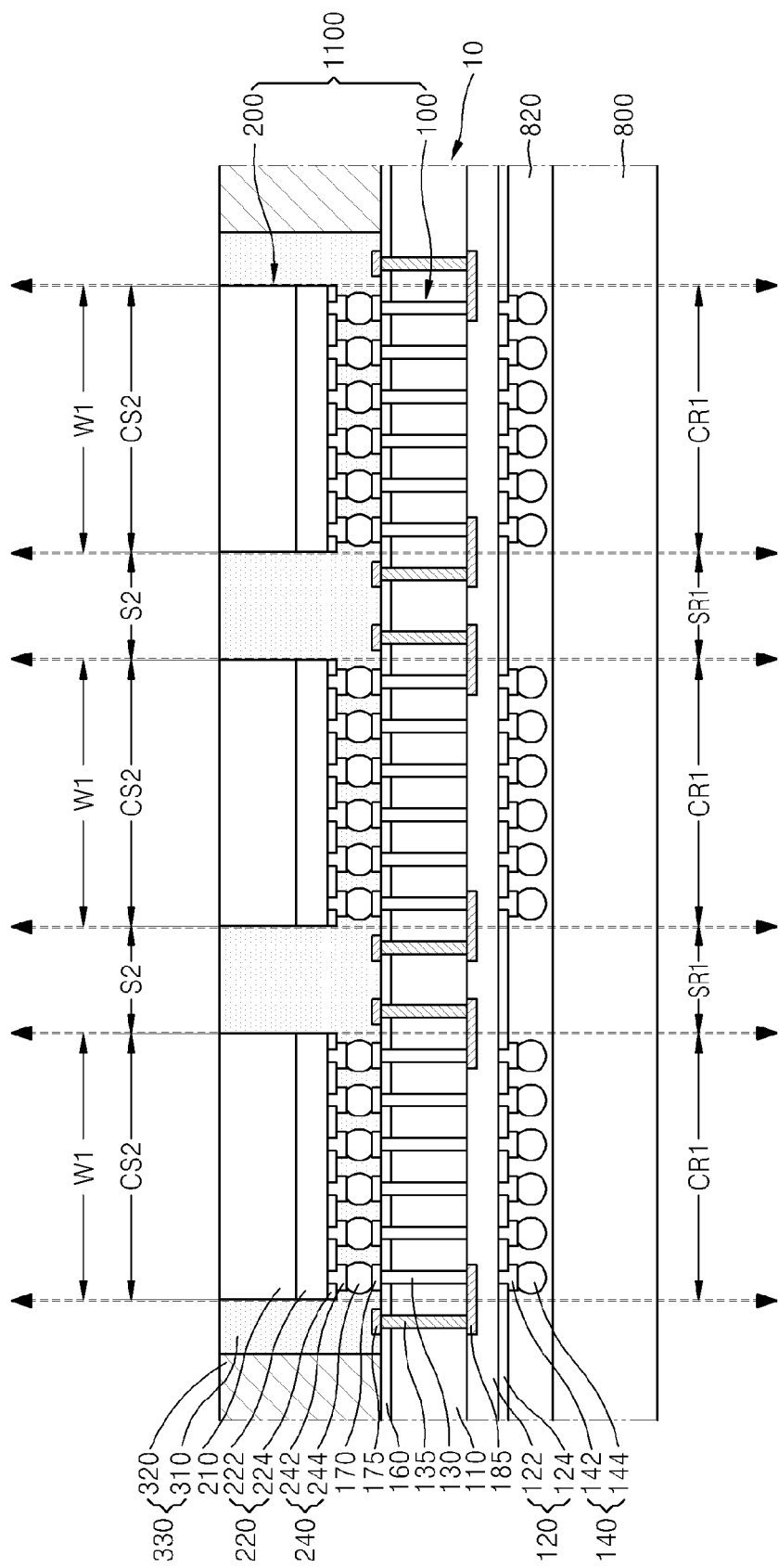

Referring to FIG. 7, semiconductor packages 1000 (refer to FIG. 8) are separated by sawing the base wafer 10 and the sealing member 330 by a first width W1. At this point, a portion of the adhesive member 820 may be removed by the sawing. In the embodiment shown in FIG. 7, the base wafer 10 and the sealing member 330 are cut according to the width of the chip region CR1. In FIG. 7, the width CS2 of the second chip 200 is substantially the same as that of the chip region CR1. Accordingly, the width CS2 of the second chip 200 is substantially the same as the width W1 of the semiconductor package 1000. However, unlike this, when the width CS2 of the second chip 200 is formed slightly smaller than the width W1 of the chip region CR1, the semiconductor package 1000 may include the sealing member 330 that surrounds the side surfaces of the second chip 200.

In one embodiment, the dummy TSVs 135 and the test pads 175 formed in the scribe regions SR1 may be removed by the sawing. The dummy wiring line 185 that connects the dummy TSV 135 and the main TSV 130 may extend from within the lower insulating layer 120 of the chip region CR1 to within the lower insulating layer 120 of the scribe regions SR1, and thus, the dummy wiring line 185 may be cut by the sawing. The portion of the dummy wiring line 185 in the chip region CR1 may remain, and the portion of the dummy wiring line 185 in the scribe region SR1 may be removed.

Accordingly, each of the separated semiconductor packages 1000 may not include the dummy TSV 135 and the test pad 175, but may include the portion of the dummy wiring line 185 in the chip region CR1. Also, the dummy wiring lines 185 at the side surfaces of the first chip 100 may be exposed. As such, in one embodiment, a separated semiconductor device, such as a separated semiconductor package 1000, includes a dummy wiring line 185 that extends from one end, where it electrically connects to circuitry within chip 100, to a second end, which is a floating end and does not electrically connect to other circuitry. Where an insulative capping layer is included to surround the side surfaces of the chip 100, the dummy wiring line 185 terminates at the side surface of the chip 100, and may contact the insulative capping layer. As such, the dummy wiring line is not capable of forming an electrical connection with any other circuitry.

Figure 8:
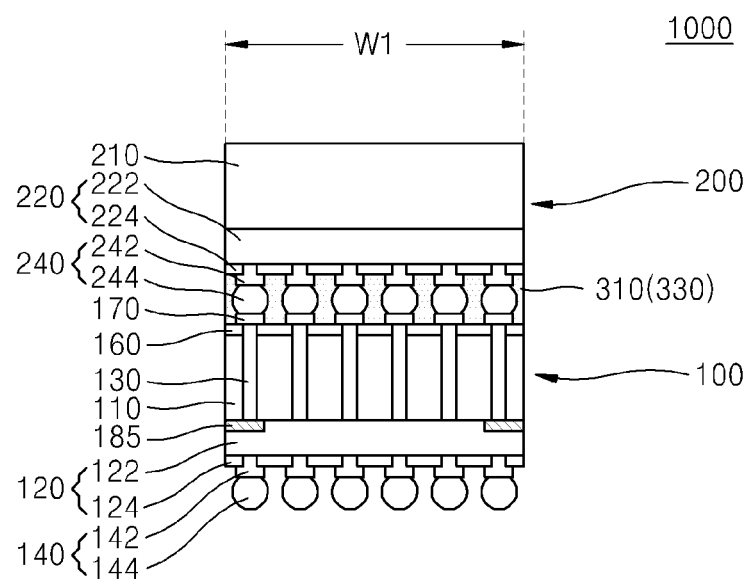

Referring to FIG. 8, the manufacture of each of the semiconductor packages 1000 is completed by removing the supporting carrier 800 (refer to FIG. 7) and the adhesive member 820 (refer to FIG. 7). The supporting carrier 800 and the adhesive member 820 may be removed sequentially or at the same time. For example, if the supporting carrier 800 is formed of a transparent material, for example, a glass substrate, and the adhesive member 820 is formed of a UV sensitive film, the supporting carrier 800 and the adhesive member 820 may be simultaneously separated from the base wafer 10 by UV irradiation.

The side surfaces of the first chip 100 of the semiconductor package 1000 may be exposed, and the dummy wiring lines 185 are exposed at the side surfaces of the first chip 100. In this case, when an additional molding is performed to mount the semiconductor package 1000 on a board substrate, an additional molding member may be easily attached to the side surfaces of the first chip 100. As described above, the additional molding may contact the cut ends of the dummy wiring lines 185.

According to certain embodiments, the dummy TSVs 135 and the test pads 175 are formed in the scribe regions SR1 of the base wafer 10. When the second chips 200 are mounted on the first chips 100 of the base wafer 10, an EDS test is performed through the test pads 175 of the scribe regions SR1. Accordingly, a connection failure of the stacked chips 1100 may be detected without a PCB substrate or an interposer. When the first chip 100 and the second chip 200 have the same size, or even though the second chip 200 has a slightly smaller size than that of the first chip 100, the upper surfaces of the test pads 175 are not covered, and thus, the EDS test may be readily performed. Accordingly, the semiconductor packages 1000 may have a good reliability.

Here, the structure and characteristics of an exemplary semiconductor package 1000 manufactured by the method described above with reference to FIG. 8 are briefly described.

Each of the semiconductor packages 1000 includes the first chip 100, the second chip 200, and the sealing member 330. The first chip 100 may include the body layer 110, the lower insulating layer 120, the main TSVs 130, the first connection member 140, the protection layer 160, the upper pads 170, and the dummy wiring lines 185. The bumps 144 are exposed to the outside on a lower side of the first chip 100, and the passivation layer 124 on an active surface of the first chip 100 is exposed to the outside. The dummy wiring lines 185 are exposed to the outside at side surfaces of the first chip 100 and are connected to the main TSVs 130.

The second chip 200, like the first chip 100, may include the body layer 210, the lower insulating layer 220, and the second connection member 240. The second chip 200 may not include TSVs as in FIG. 8, or may include TSVs if necessary. The stacked chip 1100 may be configured by mounting an active surface of the second chip 200 onto the active surface of the first chip 100, and thus, the second connection members 240 may be connected to the upper surfaces of the upper pads 170 of the first chip 100. As a result, the second chip 200 may be electrically connected to the main TSVs 130 of the first chip 100 through the second connection members 240.

The sealing member 330 may be filled in a connection portion between the first chip 100 and the second chip 200, for example, around a portion at which the upper pads 170 of the first chip 100 is connected to the second connection members 240.

As described above, the semiconductor package 1000 may have a good reliability because it may be easy to perform an EDS test through the test pads 175 formed in the scribe region SR1 while the test pads 175 are exposed.

Figure 9:
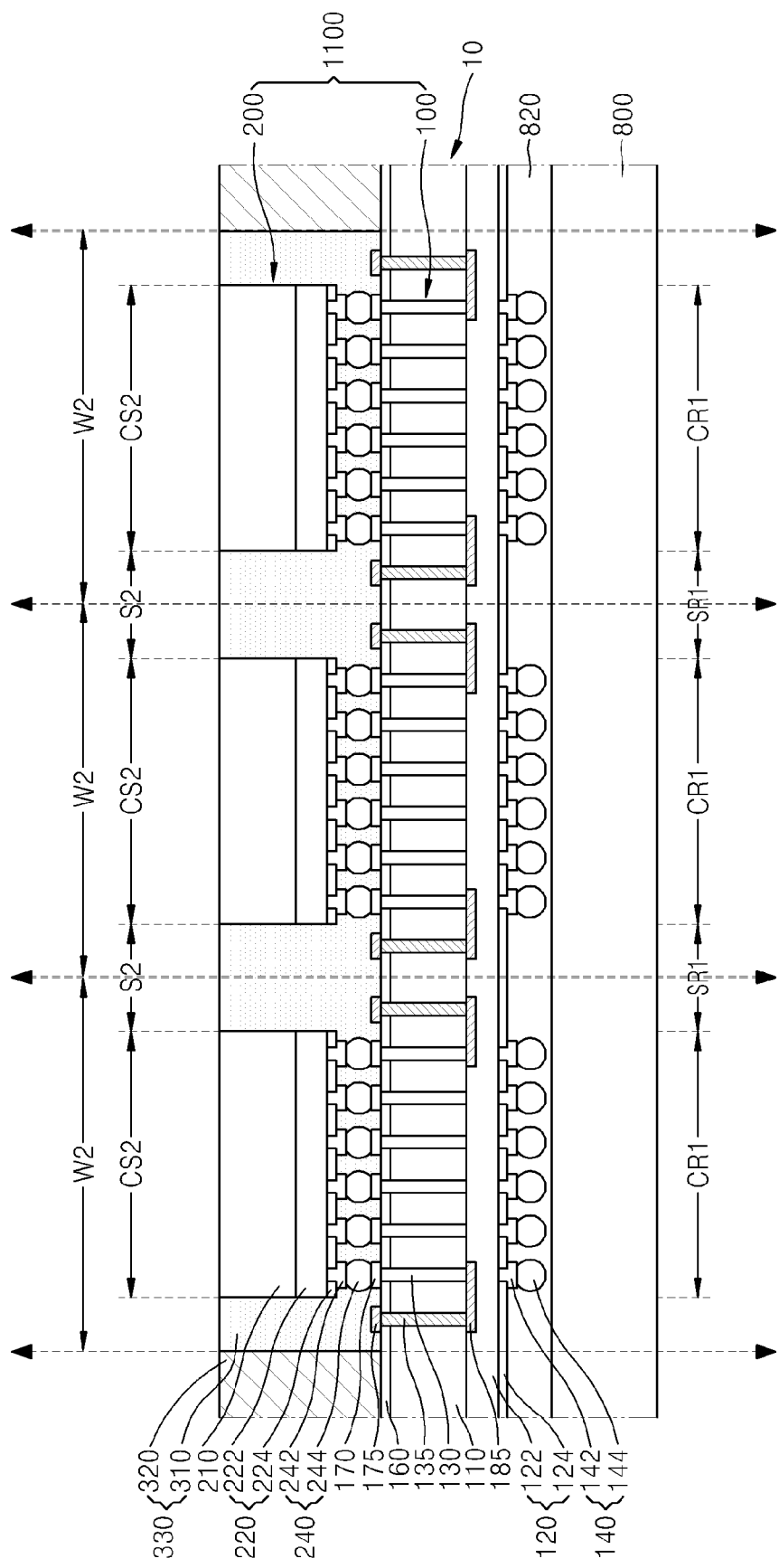
FIGS. 9 and 10 are cross-sectional views for describing a method of manufacturing semiconductor packages, according to another exemplary embodiment.
Figure 10:
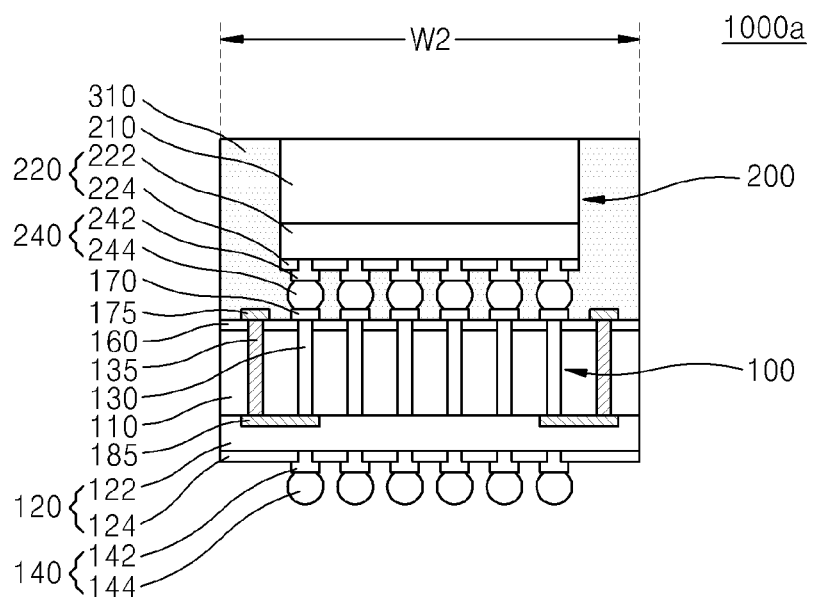

FIGS. 9 and 10 are cross-sectional views for describing a method of manufacturing semiconductor packages 1000a (refer to FIG. 10), according to an exemplary embodiment. The method is substantially the same as the method described with reference to FIGS. 1 through 8 except for the cutting process of the base wafer 10 and the sealing member 330.

Referring to FIG. 9, a plurality of second chips 200 are mounted on the base wafer 10 on which the plurality of first chips 100 are formed by performing the manufacturing processes described with reference to FIGS. 1 through 8, and afterwards, a supporting carrier 800 is attached to a lower side of the base wafer 10. Main TSVs 130 are formed in chip regions CR1 of the base wafer 10, dummy TSVs 135 and test pads 175 are formed in the scribe regions SR1, and the dummy TSVs 135 and the main TSVs 130 are electrically connected by dummy wiring lines 185 in the lower insulating layer 120. The sealing member 330 may cover a connection portion between the first chips 100 and the second chips 200, and may surround side surfaces of the second chips 200.

Afterwards, the base wafer 10 and the sealing member 330 are cut into a plurality of semiconductor packages 1000a (refer to FIG. 10) by a sawing process. The first chip 100 of each of the semiconductor packages 1000a may be separated to include a chip region CR1 and scribe regions SR1 at both side surfaces of the chip region CR1. For example, because the chip regions CR1 are separated by interposing the scribe regions SR1 therebetween, each of the scribe regions SR1 is shared by two adjacent chip regions CR1. Accordingly, when the base wafer 10 is cut along the center line of the scribe regions SR1, the semiconductor packages 1000a may be separated to further include portions of the scribe regions SR1 on both side surfaces of the chip regions CR1.

In an example embodiment, the semiconductor package 1000a has a width W2 that is greater than a width of the chip regions CR1 of the base wafer 10. For example, the width W2 of the semiconductor package 1000a may correspond to the sum of a width of the chip regions CR1 and a width of the scribe regions SR1. Unlike this, the width W2 of the semiconductor package 1000a may be slightly smaller than the sum of the width of the chip regions CR1 and the width of the scribe regions SR1. For example, when the base wafer 10 is cut using a blade (not shown) having a predetermined thickness, the width W2 of the cut semiconductor package 1000a may be reduced as much as the thickness of the blade.

In an example embodiment, the dummy TSVs 135 and the test pads 175 formed in the scribe regions SR1 may be included within the semiconductor package 1000a without being removed in the sawing process. Also, the dummy TSVs 135, the test pads 175, and the dummy wiring lines 185 may not be exposed at side surfaces of the first chip 100. Unlike this, portions of the dummy TSVs 135 and the test pads 175 formed in the scribe regions SR1 may be cut in the sawing process, and thus, portions of the dummy TSVs 135 and/or the test pads 175 may be exposed at the side surfaces of the semiconductor package 1000a.

Also, the sealing member 330 that surrounds side surfaces of the second chip 200 may be exposed on side surfaces of the semiconductor package 1000a. For example, in the case that the width CS2 of the second chip 200 is substantially identical to the width of the chip region CR1 of the base wafer 10, the width CS2 of the second chip 200 may be formed smaller than the width W2 of the semiconductor package 1000a. Accordingly, the sealing member 330 that surrounds the side surfaces of the second chip 200 is exposed on the side surfaces of the semiconductor package 1000a.

Referring to FIG. 10, the manufacture of each of the stacked chips of semiconductor packages 1000a is completed by removing the supporting carrier 800 and the adhesive member 820. The supporting carrier 800 and the adhesive member 820 may be removed sequentially or at the same time. When an individual semiconductor package 1000a is formed through a cutting process of FIG. 9, as depicted in FIG. 10, both side surfaces of the first chip 100 are exposed. However, as mentioned previously, the side surfaces may be later covered in a further process when providing a molding, for example, when mounting the package to a board in a subsequent process.

According to certain embodiments, an EDS test may be performed at a state of having stacked the second chip 200 by using the dummy TSVs 135 and the test pads 175 that are formed in the scribe regions SR1 prior to adding the sealing member 330. Accordingly, a connection failure may be detected without a PCB substrate or an interposer. Also, when the base wafer 10 is cut, the cutting may be performed to include the chip regions CR1 and the scribe regions SR1, and thus, the dummy TSVs 135 and the test pads 175 may not be exposed on the cut side surfaces of the first chip 100.

Here, the structure and characteristics of the semiconductor package 1000a manufactured by the method described above with reference to FIG. 10 are briefly described.

The semiconductor package 1000a of FIG. 10 is similar to the semiconductor package 1000 of FIG. 8 except that the cutting is performed to include the scribe regions SR1 on both side surfaces of the first chip 100.

The dummy TSVs 135 and the test pads 175 are formed in the scribe region SR1. Since the base wafer 10 is cut so that the dummy TSVs 135 and the test pads 175 are not exposed at the side surfaces of the first chip 100, the dummy wiring lines 185 are not exposed at the side surfaces of the first chip 100. As a result, the dummy conductive connectors (which may include, for example, the dummy TSVs, test pads, and dummy wiring lines) connect to circuitry of the first chip 100 on one end, and remain floating on the other end. When covered with an insulating material, the dummy conductive connectors are then not capable of forming an electrical connection with other circuitry on the floating end.

The sealing member 330 fills a connection portion between the first chip 100 and the second chip 200, for example, around a portion at which the upper pads 170 of the first chip 100 is connected to the second connection members 240, and both side surfaces of the second chip 200 are surrounded by the sealing member 330.

As described above, the semiconductor package 1000a may have a good reliability because it may be easy to perform an EDS test through the test pads 175 formed in the scribe region SR1 while the second chip 200 is stacked.

FIGS. 11A through 11I are cross-sectional views for describing a method of manufacturing the base wafer 10 that is used for manufacturing semiconductor packages according to certain exemplary embodiments. FIGS. 11A through 11I show magnified portions of the chip region CR1 and the scribe regions SR1 of the base wafer 10 according to certain embodiments.

Figures 11A, 11B:
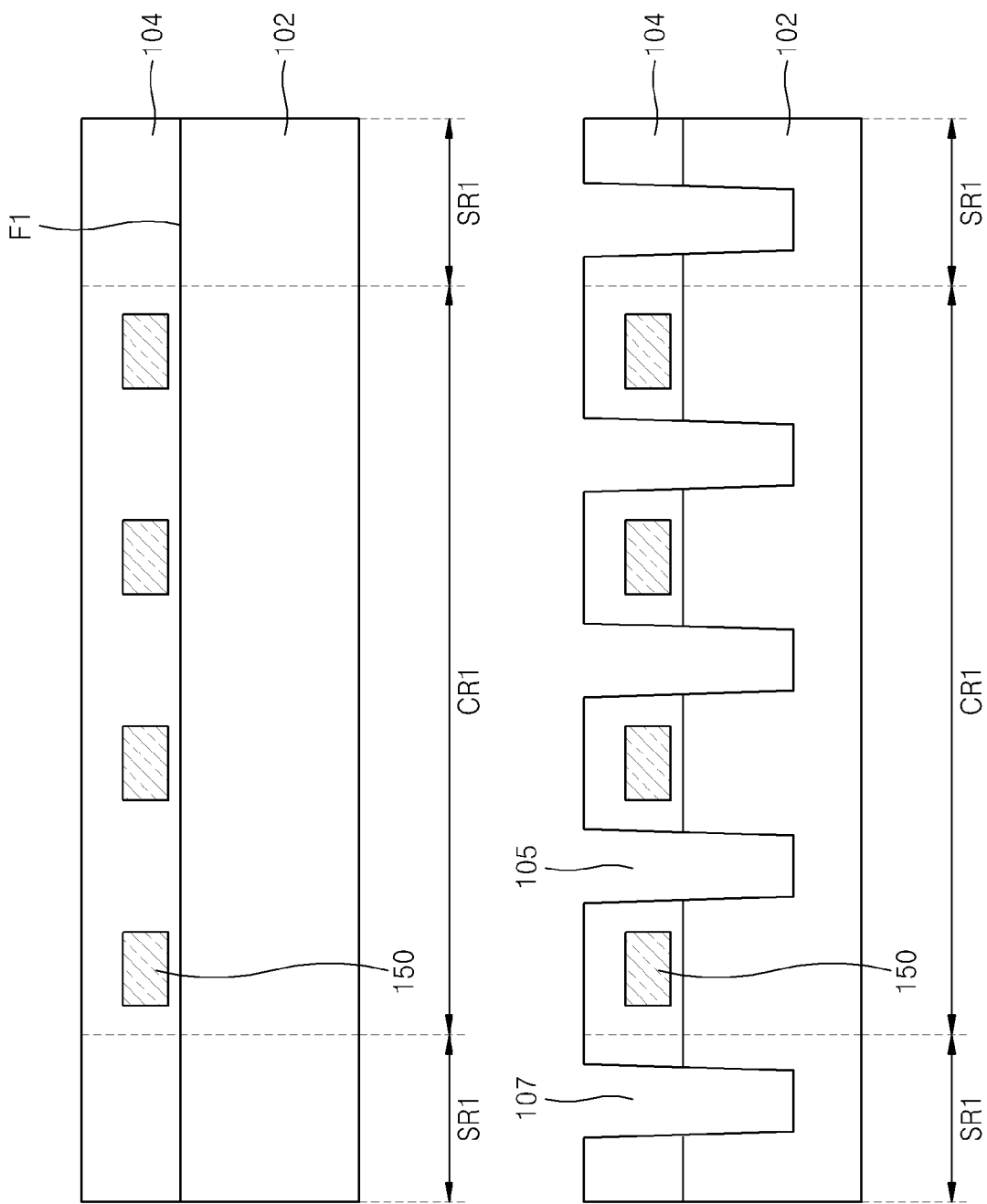
FIGS. 11A through 11I are cross-sectional views for describing a method of manufacturing a base wafer that is used for manufacturing semiconductor packages according to an exemplary embodiment.

Referring to FIG. 11A, a substrate 102 may be divided into a chip region CR1 and scribe regions SR1. The scribe regions SR1 may be formed to have a predetermined width around the chip region CR1. The substrate 102 may include a semiconductor substrate, such as, for example, a silicon substrate, a germanium substrate, a silicon-germanium substrate, a silicon-on-insulator (SOI) substrate.

Integrated circuit units 150 are formed on a first surface F1 of the substrate 102 in the chip region CR1. The integrated circuit units 150 may include various circuit devices according to the kind of semiconductor chips. For example, the integrated circuit units 150 may be devices that perform various functions, such as a memory, a logic, a microprocessor, an analog device, a digital signal processor, or a system-on-chip.

An insulating interlayer 104 that covers the integrated circuit units 150 is formed on the first surface F1 of the substrate 102. The insulating interlayer 104 may be formed on the substrate 102 to cover all of the chip region CR1 and the scribe regions SR1. In one embodiment, the insulating interlayer 104 may be formed of a material selected from the group consisting of silicon oxide, silicon nitride, and silicon oxynitride by using a chemical vapour deposition (CVD) process, an atomic layer deposition (ALD) process, a physical vapor deposition (PVD) process, or a combination of these processes. If the insulating interlayer 104 is not formed flat according to the profile of the integrated circuit units 150, an upper surface of the insulating interlayer 104 may be planarized by further performing a chemical mechanical polishing (CMP) process or an etch-back process.

Referring to FIG. 11B, first via holes 105 and second via holes 107 are respectively formed in the chip region CR1 and the scribe regions SR1, for example, by etching the insulating interlayer 104 and the substrate 102. The first and second via holes 105 and 107 may be formed through the insulating interlayer 104 and to have a predetermined depth from the first surface F1 of the substrate 102.

In an example embodiment, the first and second via holes 105 and 107 may be formed by using an anisotropic etching process or a laser drilling technique. For example, after forming a photoresist pattern (not shown) on the insulating interlayer 104, the first and second via holes 105 and 107 may be formed by sequentially etching the insulating interlayer 104 and the substrate 102 using the photoresist pattern as an etch mask. The first and second via holes 105 and 107 may have various shapes according to etching conditions and drilling conditions. For example, the first and second via holes 105 and 107 may have a cylindrical shape in which an upper width and a lower width are relatively uniform, or may have a shape in which the width gradually reduces from top to bottom.

Figure 11C:
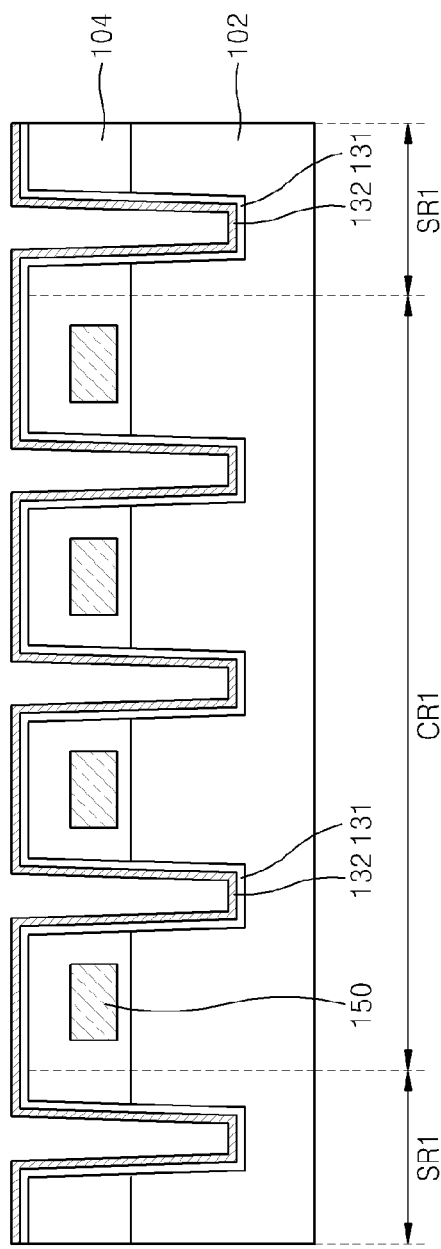

Referring to FIG. 11C, an insulating layer 131 that covers inner walls and bottoms of the first and second via holes 105 and 107 is formed. The insulating layer 131 may be formed to cover a surface of the substrate 102 and a surface of the insulating interlayer 104 with a uniform thickness. In an example embodiment, the insulating layer 131 may be formed of a material selected from the group consisting of silicon oxide, silicon nitride, and silicon oxynitride by using a CVD process or a PVD process.

Afterwards, a barrier layer 132 is formed on the insulating layer 131. The barrier layer 132 may be formed on the inner walls and the bottoms of the first and second via holes 105 and 107 to cover the insulating layer 131 with a uniform thickness. In an example embodiment, the barrier layer 132 may be formed of a material selected from the group consisting of Ti, Ta, TiN, TaN, and a multiple film of these materials by using a PVD process.

Figure 11D:
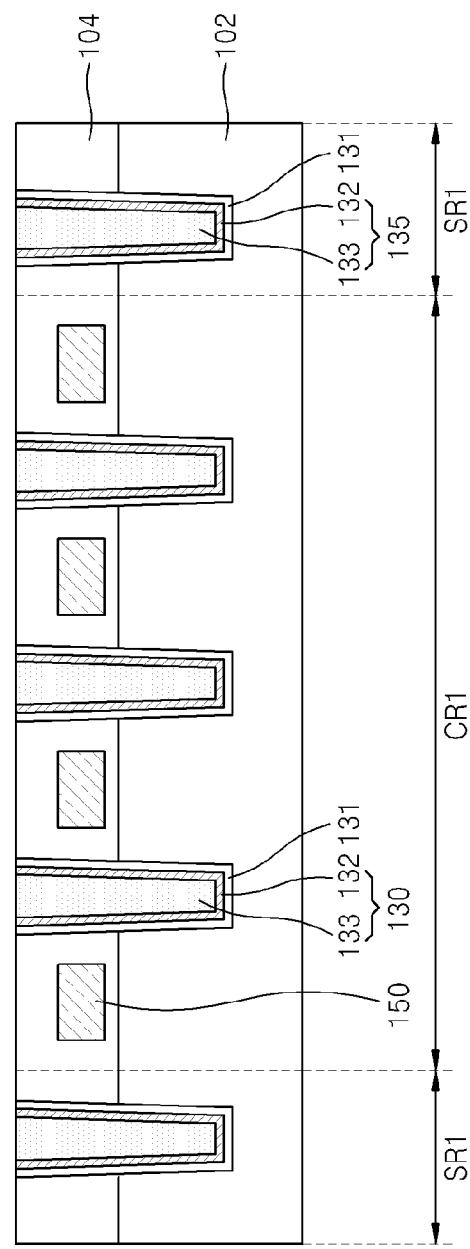

Referring to FIG. 11D, a conductive layer 133 may be formed to fill the first and second via holes 105 and 107. In example embodiments, the conductive layer 133 may be formed of a material selected from the group consisting of W, Al, Cu, and a combination of these materials by using a PVD process or an electroplating process. When an electroplating process is used, a metal seed layer (not shown) may be formed on the barrier layer 132 using a PVD process, and then, the conductive layer 133 may be formed on the metal seed layer.

Afterwards, the insulating layer 131, the barrier layer 132, and the conductive layer 133 remain in the first and second via holes 105 and 107 by planarizing the conductive layer 133, the barrier layer 132, and the insulating layer 131 until an upper surface of the insulating interlayer 104 is exposed. The planarizing may be performed, for example, by using a CMP process or an etch-back process.

According to other embodiments, the first and second via holes 105 and 107 may be formed after forming a polishing stop layer (not shown) on the insulating interlayer 104. In this case, after sequentially forming the insulating layer 131, the barrier layer 132, and the conductive layer 133 in the first and second via holes 105 and 107, a CMP process or an etch-back process may be performed until the polishing stop layer is exposed. Afterwards, the polishing stop layer may be removed.

The barrier layer 132 and the conductive layer 133 formed in the first via holes 105 may be referred to as the main TSVs 130, and the barrier layer 132 and the conductive layer 133 formed in the second via holes 107 may be referred to as the dummy TSVs 135. Accordingly, in one embodiment, the main TSVs 130 are formed in the chip region CR1 of the substrate 102, and the dummy TSVs 135 are formed in the scribe regions SR1 of the substrate 102.

Figure 11E:
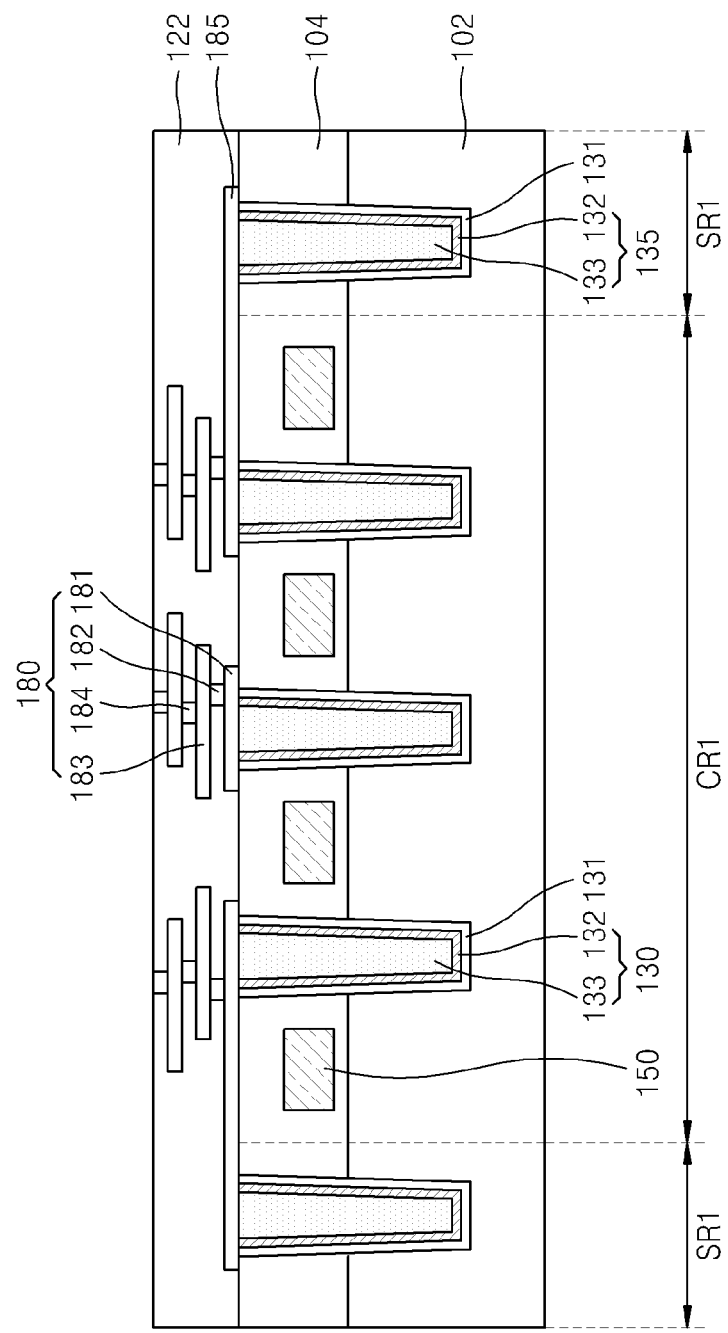

Referring to FIG. 11E, multi-layer wiring patterns 180 connected to the main TSVs 130 and an intermetallic insulating layer 122 that covers the multi-layer wiring patterns 180 may be formed. The multi-layer wiring patterns 180 may be formed by repeating an operation of forming a stacking structure of a plurality of first and second wiring lines 181 and 183 and first and second vertical plugs 182 and 184. The intermetallic insulating layer 122 may be formed in a multi-layer structure according to the stacking structure of the multi-layer wiring patterns 180. In example embodiments, the multi-layer wiring patterns 180 may be formed of a material selected from the group consisting of Al, W, Cu, and a combination of these materials.

In example embodiments, the first wiring line 181 may be formed by patterning a conductive layer (not shown) after forming the conductive layer on the insulating interlayer 104. Afterwards, a first insulating layer (not shown) may be formed on the insulating interlayer 104 to cover the first wiring line 181, and the first insulating layer is planarized until the first wiring line 181 is exposed. A second insulating layer (not shown) may be formed to cover the first wiring line 181 and the first insulating layer, and an opening (not shown) that expose a portion of the first wiring line 181 may be formed. A conductive layer (not shown) may be formed to fill the opening, and the first vertical plug 182 that is electrically connected to the first wiring line 181 may be formed in the opening by planarizing an upper part of the conductive layer until an upper surface of the second insulating layer is exposed. By repeating the above processes, the first and second wiring lines 181 and 183 and the first and second vertical plugs 182 and 184 may be formed. Accordingly, the multi-layer wiring patterns 180 may include the first and second wiring lines 181 and 183 and the first and second vertical plugs 182 and 184. Also, the stacked insulating layers may be referred to as the intermetallic insulating layer 122.

In other embodiments, after forming a first insulating layer (not shown) on the insulating interlayer 104, an opening (not shown) that exposes the main TSVs 130 may be formed. After forming a conductive layer (not shown) in the opening, the first wiring line 181 may be formed by planarizing the conductive layer until an upper surface of the first insulating layer is exposed. Afterwards, after a second insulating layer (not shown) is formed on the first wiring line 181 and the first insulating layer, an opening (not shown) that exposes the first wiring line 181 may be formed. After forming a conductive layer (not shown) that fills the opening, the first vertical plug 182 that is electrically connected to the first wiring line 181 may be formed by planarizing the conductive layer until an upper surface of the second insulating layer is exposed. By repeating the above processes, the first and second wiring lines 181 and 183 and the first and second vertical plugs 182 and 184 may be formed. Accordingly, the multi-layer wiring patterns 180 may include the first and second wiring lines 181 and 183 and the first and second vertical plugs 182 and 184, and the stacked insulating layers may be referred to as the intermetallic insulating layer 122.

The dummy wiring lines 185 that are connected to the dummy TSVs 135 and the main TSVs 130 are formed in the scribe regions SR1 of the substrate 102. In certain embodiments, in the process of forming the multi-layer wiring patterns 180, the first wiring line 181 is formed in the chip region CR1 by patterning the conductive layer, and the dummy wiring lines 185 that extend from the chip region CR1 to the scribe regions SR1 may be formed. Accordingly, the dummy wiring lines 185 may be formed on the insulating interlayer 104, and upper surfaces of the dummy wiring lines 185 may be formed at the same level as the upper surface of the first wiring line 181. In FIG. 11E, the dummy wiring lines 185 are formed on the insulating interlayer 104 to electrically connect the main TSVs 130 in the chip region CR1 to the dummy TSVs 135 in the scribe regions SR1. However, unlike this, the dummy wiring lines 185 may be formed in the intermetallic insulating layer 122 to electrically connect the main TSVs 130 in the chip region CR1 to the dummy TSVs 135 in the scribe regions SR1. For example, the upper surfaces of the dummy wiring lines 185 may be at the same level as the upper surface of the second wiring line 183.

Figure 11F:
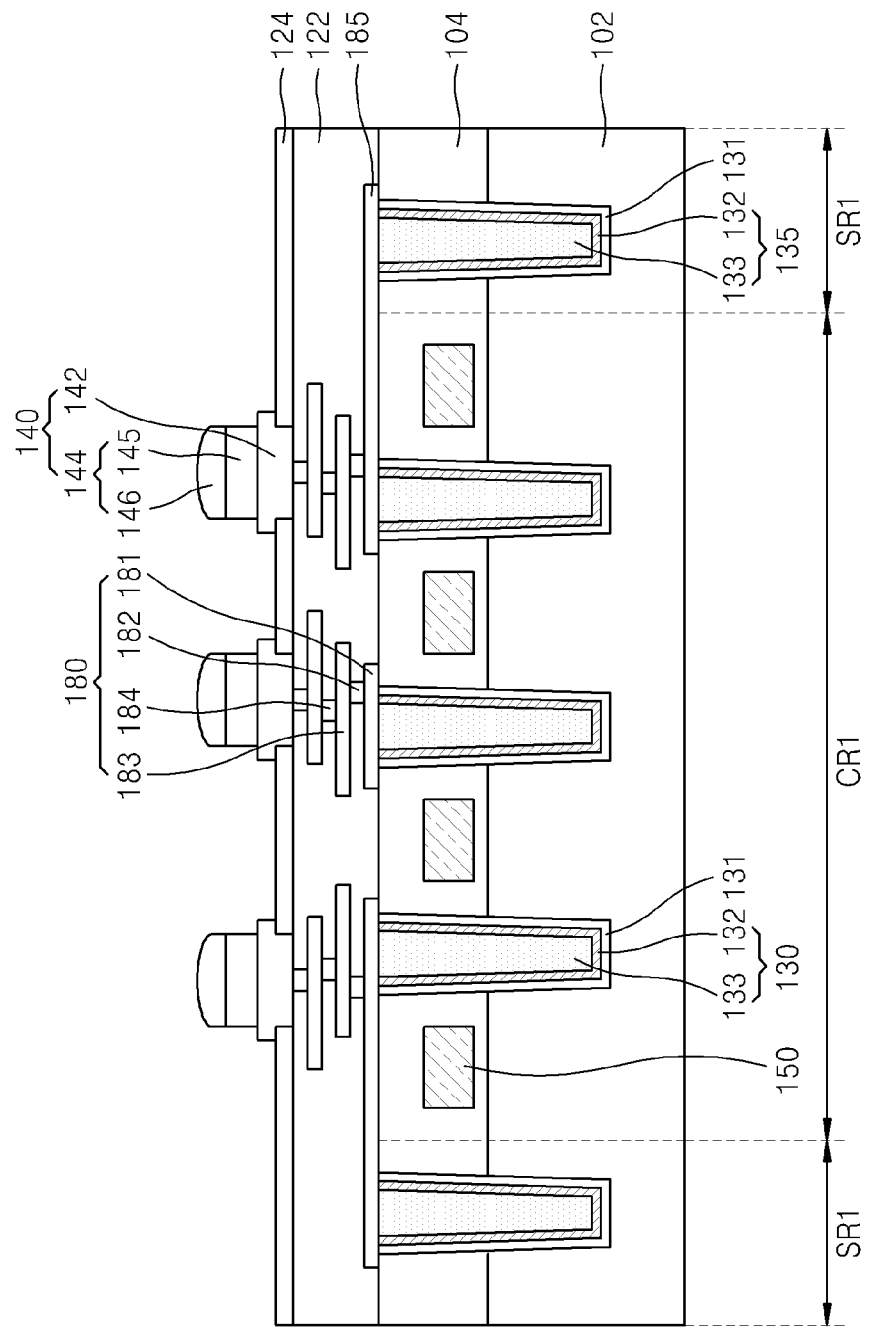

Referring to FIG. 11F, the passivation layer 124 is formed on the multi-layer wiring patterns 180 and the intermetallic insulating layer 122. The passivation layer 124 may be formed of silicon nitride or polyimide, for example, by using a CVD process, a spin coating process, or a spray process.

Next, openings (not shown) that expose the multi-layer wiring patterns 180 are formed by etching the passivation layer 124. The bump pads 142 that fill the openings are formed. The bump pads 142 may be formed, for example, of Al or Cu by using a pulse plating process or a direct current plating process. A UBM (not shown) may further be formed on each of the bump pads 142.

The bumps 144 are formed on the bump pads 142, respectively. Each of the bumps 144 may include, for example, a pillar layer 145 and a solder layer 146. According to the current embodiments, a photoresist pattern (not shown) is formed on the passivation layer 124 and the bump pads 142, and openings (not shown) that expose a portion of the bump pads 142 are formed in the photoresist pattern. The openings are filled with a conductive material, such as Cu, by using an electroplating process, and thus, pillar layers 145 that contact the bump pads 142, respectively, are formed. The pillar layers 145 may be formed of a material selected, for example, from the group consisting of Al, Cu, Au, and solder. The solder layers 146 are formed on the pillar layers 145, respectively, by using an electroplating process. Afterwards, a reflow process may further be performed.

Figure 11G:
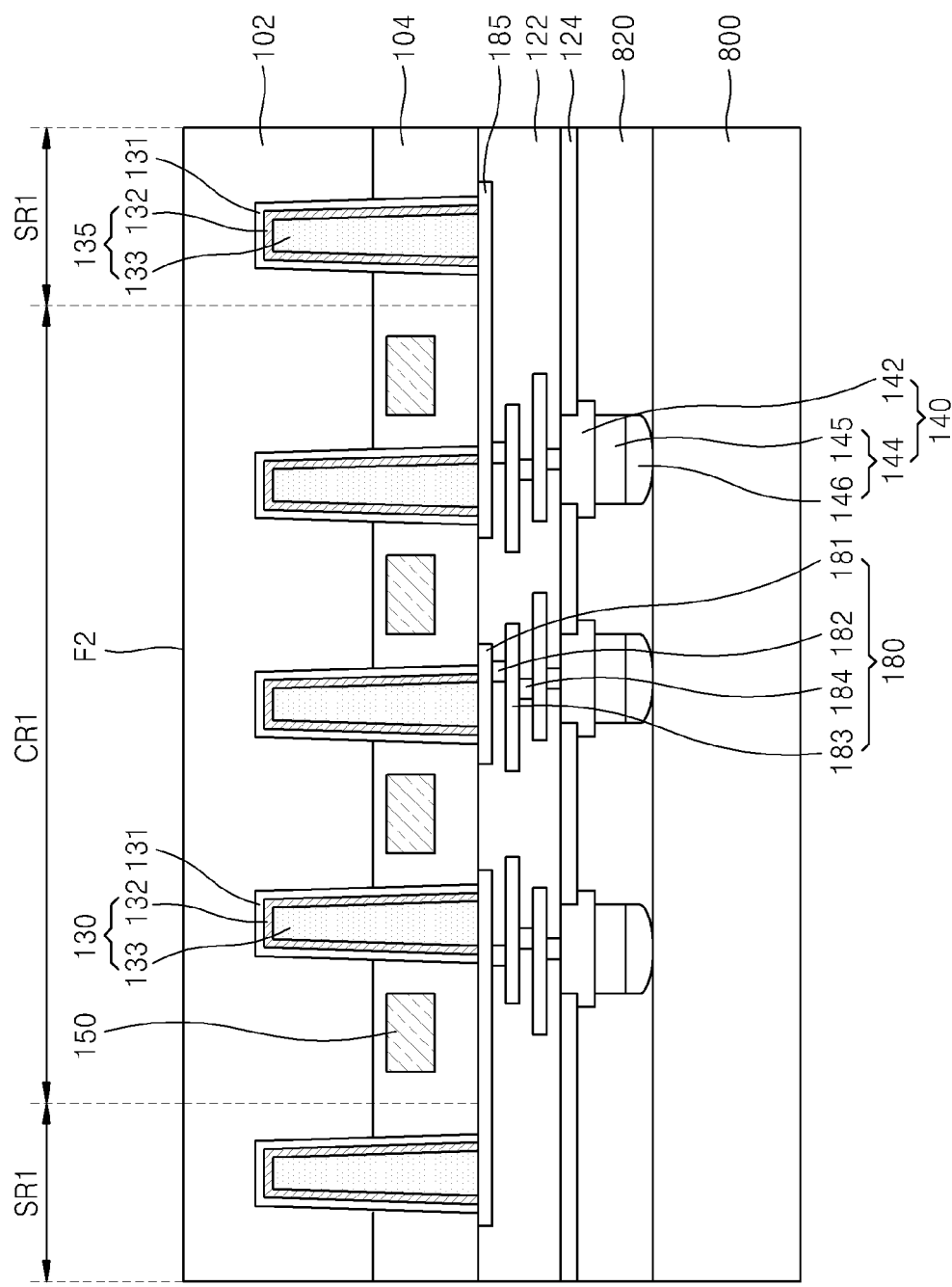

Referring to FIG. 11G, the supporting carrier 800 is attached onto the passivation layer 124 and the bumps 144 by using an adhesive member 820. The supporting carrier 800 may be formed of a material selected, for example, from the group consisting of silicon, germanium, silicon-germanium, gallium-arsenic (GaAs), glass, plastic, and ceramic. The adhesive member 820 may be formed of a material selected, for example, from the group consisting of an NCF, an ACF, a UV sensitive film, an instant adhesive, a thermosetting adhesive, a laser hardening adhesive, an ultrasonic hardening adhesive, and an NCP.

Afterwards, the base wafer 10 is overturned to grind a second surface F2 of the substrate 102.

Figure 11H:
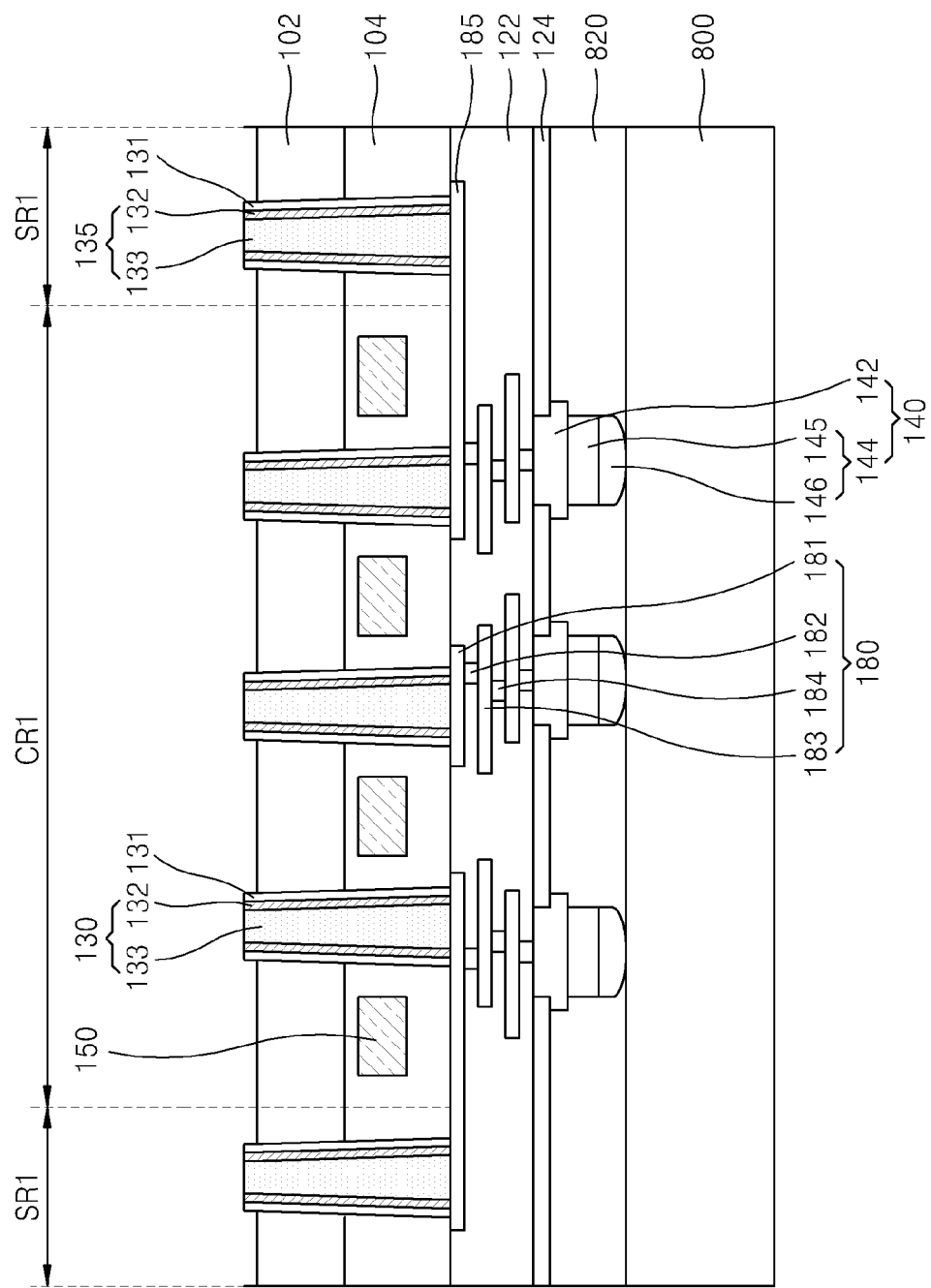

Referring to FIG. 11H, the main TSVs 130 and the dummy TSVs 135 are exposed by removing a predetermined thickness of the substrate 102 from the second surface F2 of the substrate 102.

The removal of the substrate 102 may be performed, for example, by using a CMP process, an etch-back process, an isotropic etching process, an anisotropic process, or a combination of these processes. For example, after removing a predetermined thickness from the second surface F2 of the substrate 102 by using a CMP process until the insulating layer 131 that surrounds the main TSVs 130 and the dummy TSVs 135 is exposed, the surface of the substrate 102 may be recessed to a predetermined thickness by performing an isotropic etching process or an anisotropic etching process. Afterwards, the main TSVs 130 and the dummy TSVs 135 may be exposed by removing an exposed upper surface of the insulating layer 131.

Figure 11I:
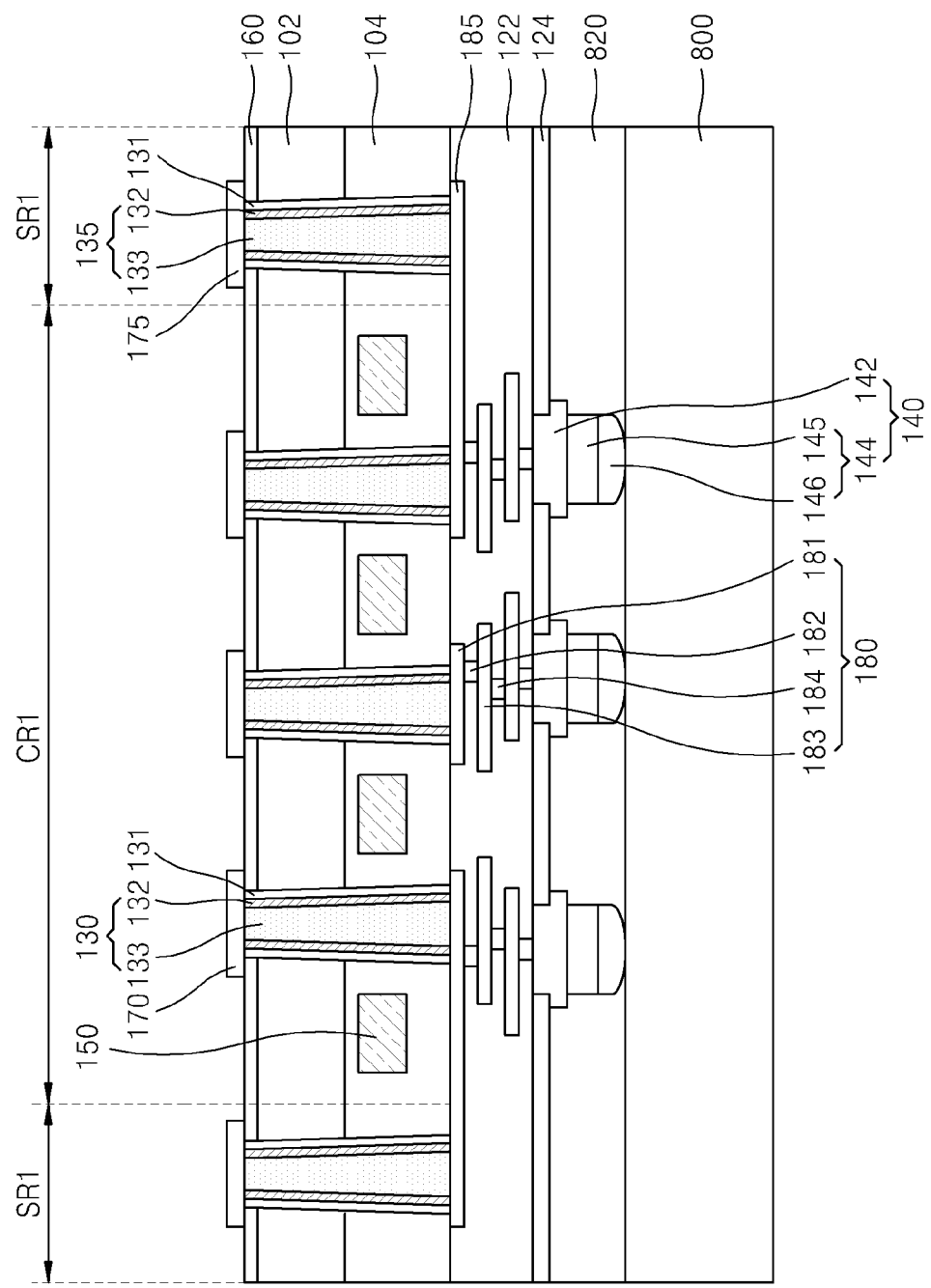

Referring to FIG. 11I, the protection layer 160 is formed on the second surface F2 of the substrate 102, and afterwards, the upper pads 170 that are connected to the main TSVs 130 and the test pads 175 that are connected to the dummy TSVs 135 are formed on the protection layer 160, respectively.

The protection layer 160 may be formed on the second surface F2 of the substrate 102 to surround sidewalls of the insulating layer 131. The protection layer 160 may be formed of an insulating material, such as, for example, an oxide or a nitride. Although not shown, all of the exposed insulating layer 131 may be removed in the process of removing the second surface F2 of the substrate 102, and sidewalls of the main TSVs 130 and the dummy TSVs 135 may be exposed. In this case, the protection layer 160 may be formed on the second surface F2 of the substrate 102 to surround the sidewalls of the main TSVs 130 and the dummy TSVs 135.

After forming a conductive layer (not shown) on the protection layer 160, the upper pads 170 and the test pads 175 may be formed to be connected to the main TSVs 130 and the dummy TSVs 135, respectively by patterning the conductive layer. The test pads 175 may be formed to have a width similar to that of the upper pads 170, and the width of the test pads 175 may be formed greater or smaller than that of the upper pads 170 according to the width of the scribe regions SR1. In the certain embodiments, the width of the test pads 175 may be in a range from about 10 μm to about 70 μm. However, the width of the test pads 175 according to the disclosed embodiments is not limited thereto.

Accordingly, the upper pads 170 are formed in the chip region CR1 of the substrate 102, and the test pads 175 are formed in the scribe regions SR1 of the substrate 102. An EDS test may be performed by connecting a probe card (not shown) to each of the test pads 175. Accordingly, the electrical connection between the main TSVs 130 and the dummy TSVs 135 may be determined favorable or not.

Figure 12:
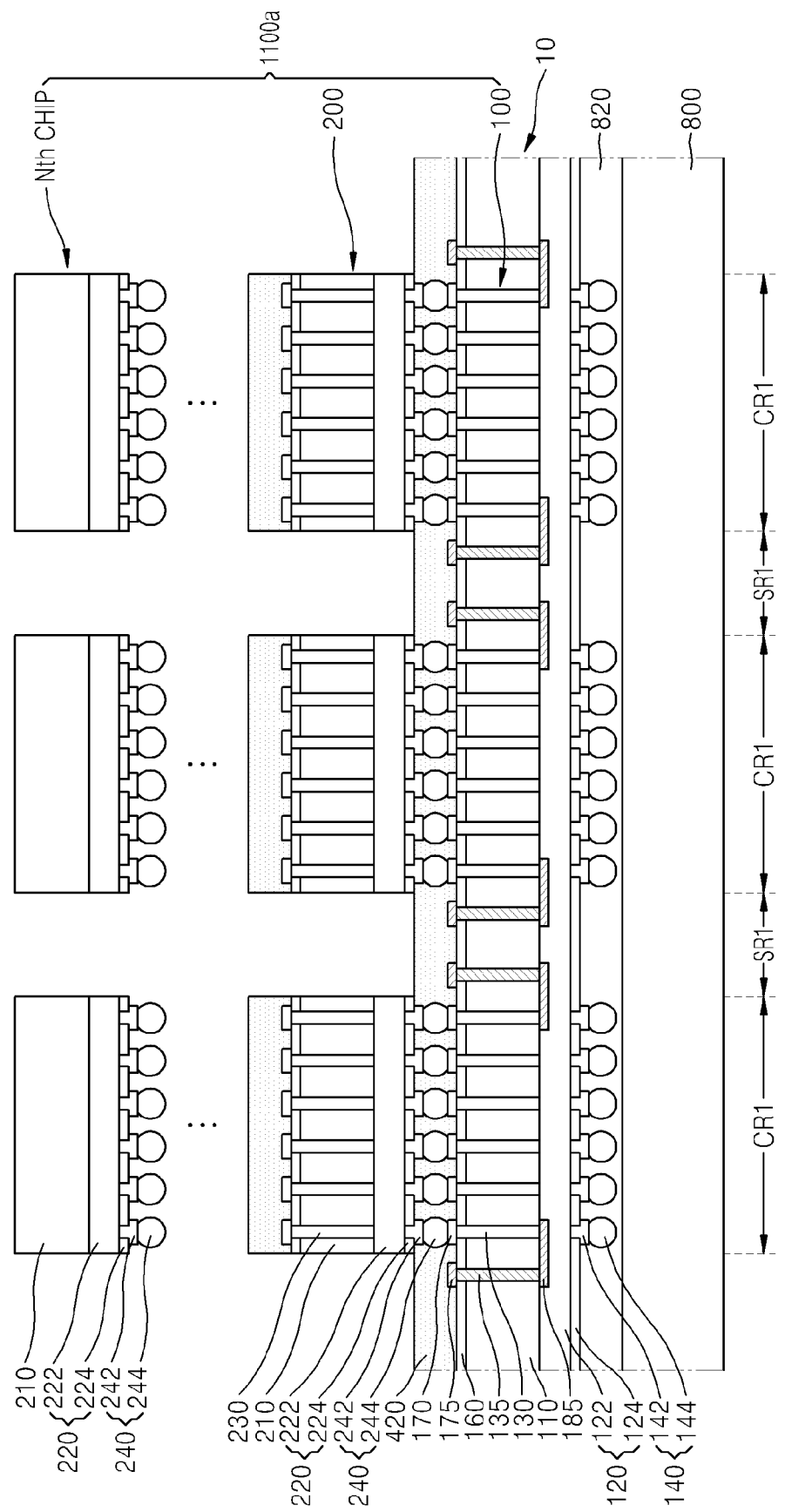
FIG. 12 is a cross-sectional view for describing a method of manufacturing semiconductor packages, according to still another exemplary embodiment.

FIG. 12 is a cross-sectional view for describing a method of manufacturing semiconductor packages, according to another exemplary embodiment. The method is similar to the method described with reference to FIGS. 1 through 8 except that a plurality of second chips 200 are stacked on the first chip 100 of the base wafer 10.

Referring to FIG. 12, a stacked chip 1100a is formed by stacking n (n is a positive integer greater than 2) number of second chips 200, that is, at least two second chips 200 on each of the first chips 100 of the base wafer 10. A plurality of the second chips 200 may be stacked one-by-one on the first chip 100 of the base wafer 10, or second chip sets in which at least two second chips 200 are bonded may be stacked on the first chip 100 of the base wafer 10. For example, a semiconductor package as depicted in FIG. 8 or FIG. 10 may be stacked on the first chips 100 of the base wafer 10.

Connecting portions between the first chip 100 and the second chip 200 may be filled with the sealing member 330 (refer to FIG. 13), such as an underfill or a molding material. Connecting portions between the second chips 200 may also be filled with the sealing member 330. In one embodiment, the sealing member 330 is not formed on an upper surface of the uppermost chip ($N^{th}$ chip), and the uppermost chip may not include TSVs.

Figure 13:
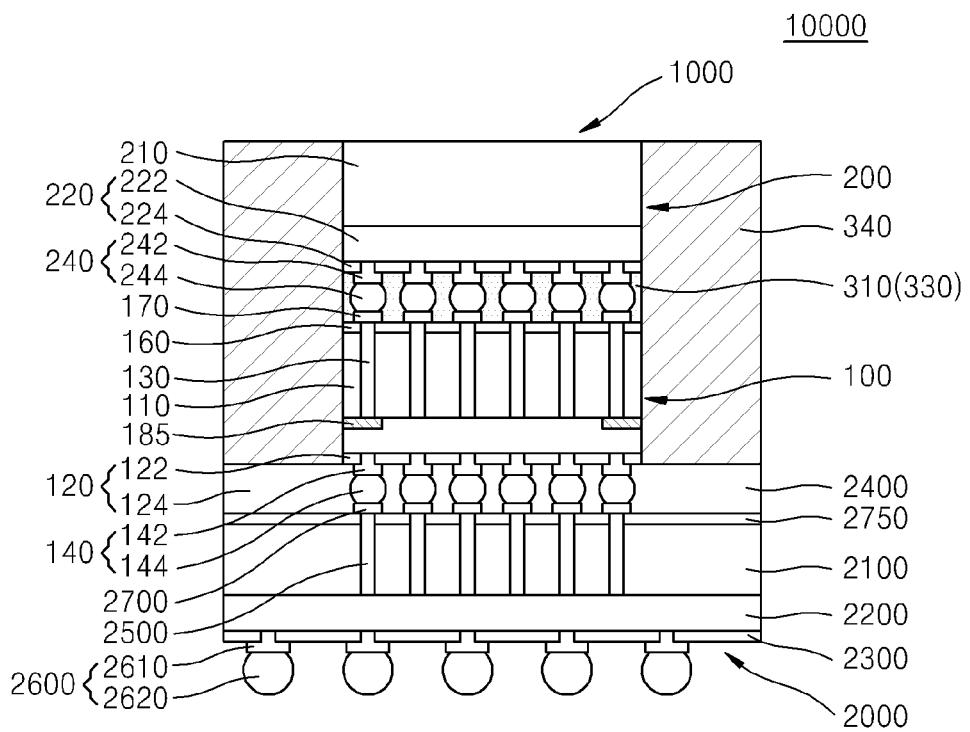
FIG. 13 is a cross-sectional view for describing a method of manufacturing a semiconductor package, according to yet another exemplary embodiment.

FIG. 13 is a cross-sectional view for describing a method of manufacturing a chip stack semiconductor package 10000, according to another exemplary embodiment.

Referring to FIG. 13, the chip stack semiconductor package 10000 may include a main chip 2000 and a semiconductor package 1000. The semiconductor package 1000 may be the same as the semiconductor package 1000 of FIG. 8. Thus, the descriptions of the constituent elements of the semiconductor package 1000 described with reference to FIG. 8 may be omitted or made in brief.

The semiconductor package 1000 is stacked on the main chip 2000. The semiconductor package 1000 is sealed with a second sealing member 340. Both side surfaces of the first chip 100 and the second chip 200 are covered with the second sealing member 340, and thus, the semiconductor package 1000 is sealed. The second sealing member 340 may be formed, for example, of a molding material described above.

In one embodiment, the main chip 2000 may have a size greater than that of the first chip 100 and the second chip 200 of the semiconductor package 1000.

A size of a horizontal cross-section of the main chip 2000 may be equal to that of the total size of a horizontal cross-section, that is, a size of a horizontal cross-section that includes a size of the second sealing member 340. The semiconductor package 1000 may be mounted onto the main chip 2000 via an adhesive member 2400. Accordingly, a lower surface of the second sealing member 340 of the semiconductor package 1000 may be bonded to an outer region of the main chip 2000 via the adhesive member 2400.

The main chip 2000, like a memory chip, may include a body layer 2100, a lower insulating layer 2200, a passivation layer 2300, TSVs 2500, third connection members 2600, a protection layer 2750, and upper pads 2700. Integrated circuit units and multi-layer wiring patterns in the lower insulating layer 2200 and the passivation layer 2300 may be formed differently according to the kind of the main chip 2000. The main chip 2000 my be a logic chip, for example, a central processing unit (CPU), a controller, or an application specific integrated circuit (ASIC). In one embodiment, in this case the chips in the semiconductor package 1000 may be, for example memory chips.

The number of TSVs 2500 and upper pads 2700 corresponding to the TSVs 2500 may be formed corresponding to the number of first connection members 140 of the first chip 100 of the semiconductor package 1000 that is stacked on the main chip 2000. In one embodiment, the number of TSVs 2500 may be greater than the number of first connection members 140.

Each of the third connection members 2600 formed on the lower surface of the main chip 2000 may include a bump pad 2610 and a bump 2620. The number of third connection members 2600 may be less than the number of TSVs 2500. Accordingly, the TSVs 2500 that do not have corresponding third connection members 2600 may be collectively connected to another third connection member 2600 through a multi-layer wiring pattern.

The third connection members 2600 formed on the lower surface of the main chip 2000 may have a size greater than that of the first connection members 140 of the semiconductor package 1000. This is because there is a limit in reducing the size of the third connection members 2600 due to the standardization of wirings formed on a board substrate (not shown) or due to physical characteristics (for example, plastic) of the board substrate. For these reasons, as described above, each of the TSVs 2500 may not correspond to individual respective third connection members 2600.

Figure 14:
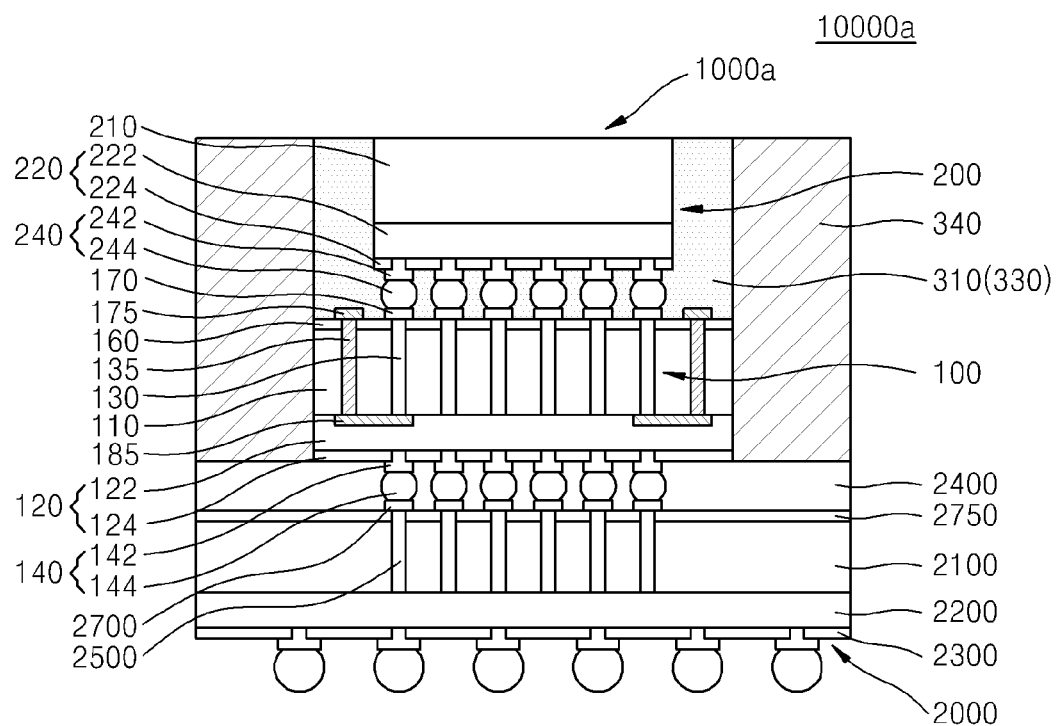
FIG. 14 is a cross-sectional view for describing a method of manufacturing a semiconductor package, according to yet still another exemplary embodiment.

FIG. 14 is a cross-sectional view for describing a method of manufacturing a chip stack semiconductor package 10000a, according to another exemplary embodiment. The chip stack semiconductor package 10000a of FIG. 14 has a structure similar to that of the chip stack semiconductor package 10000 of FIG. 13 except for the semiconductor package 1000a. Thus, for convenience of explanation, the descriptions of the elements described with reference to FIG. 13 are omitted or made in brief.

Referring to FIG. 14, in the semiconductor package 10000a according to the current embodiment, the semiconductor package 1000a may be the same as the semiconductor package 1000a of FIG. 10. Accordingly, a first sealing member 330 made of an underfill 310 is formed on both side surfaces of the second chip 200 of the semiconductor package 1000a, and a second sealing member 340 is formed on both side surfaces of the first sealing member 330 to seal the semiconductor package 1000a.

Figure 15:
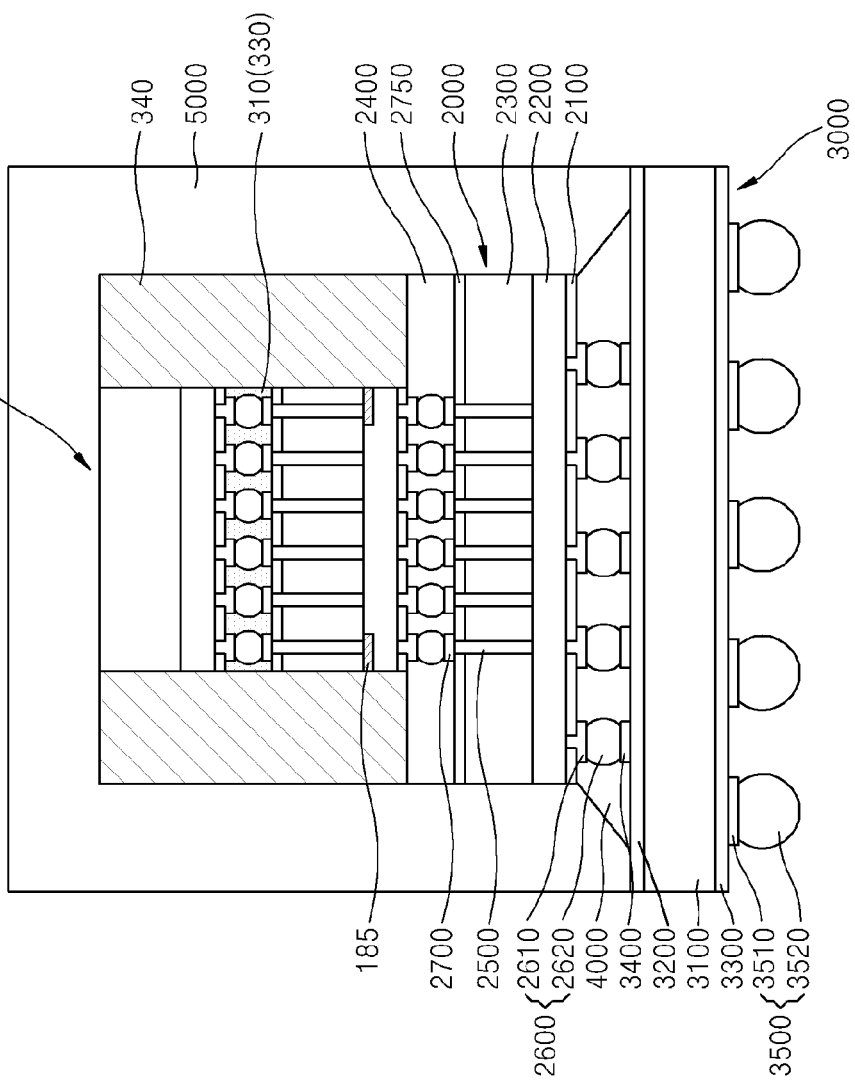
FIG. 15 is a cross-sectional view for describing a method of manufacturing a semiconductor package, according to a further exemplary embodiment.
Figure 16:
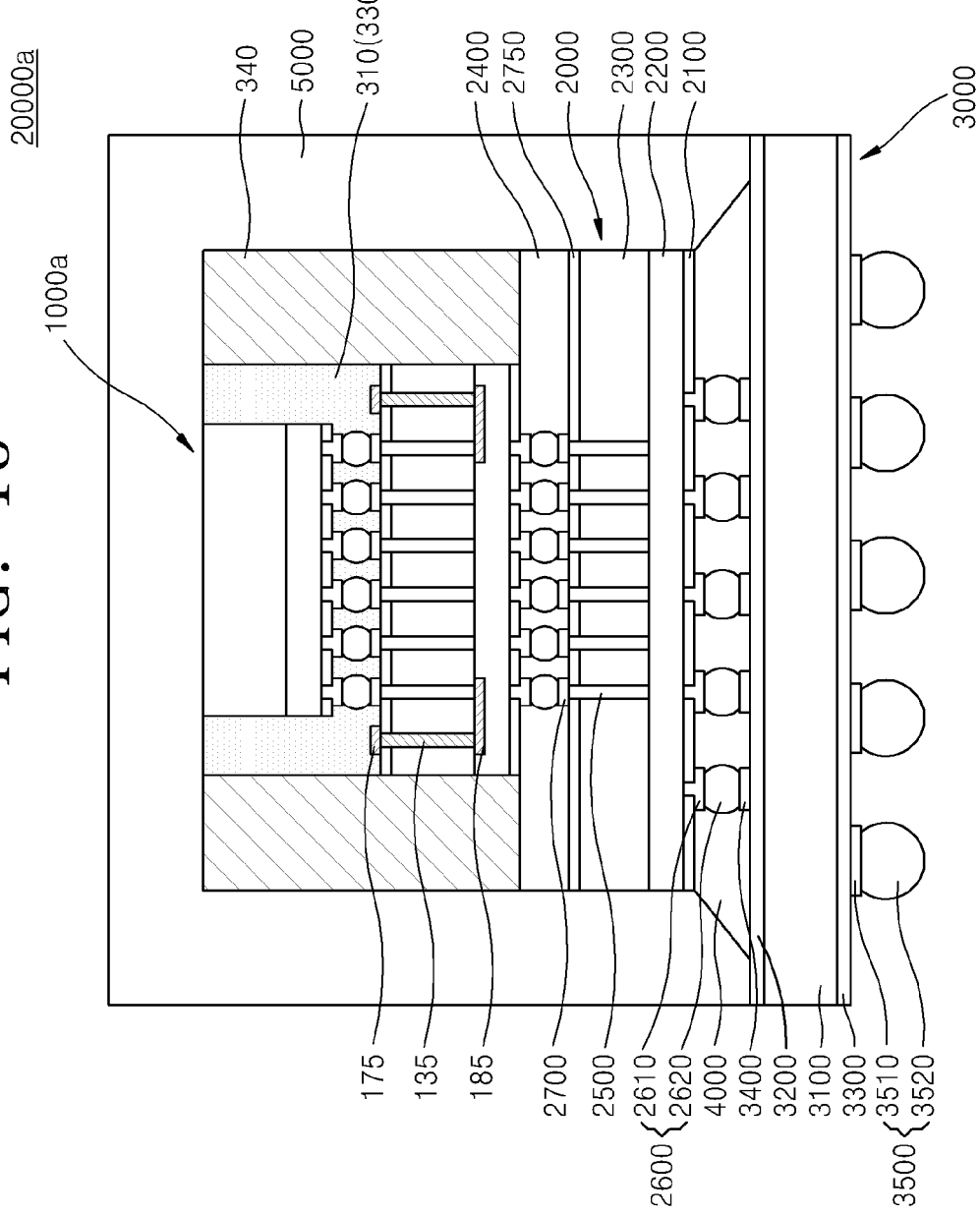
FIG. 16 is a cross-sectional view for describing a method of manufacturing a semiconductor package, according to a still further exemplary embodiment.

FIGS. 15 and 16 are cross-sectional views for describing a method of manufacturing chip stack semiconductor packages 20000 and 20000a, according to certain exemplary embodiments.

The chip stack semiconductor package 20000 of FIG. 15 may include a board substrate 3000, a main chip 2000, a semiconductor package 1000, an underfill 4000, and a third sealing member 5000. The chip stack semiconductor package 20000a of FIG. 16 may have the same structure as that of the chip stack semiconductor package 20000 of FIG. 15 except for the semiconductor package 1000a.

The semiconductor packages 1000 and 1000a and the main chip 2000 may have the same structure described with reference to FIGS. 13 and 14. Thus, the detailed descriptions of the semiconductor packages 1000 and 1000a and the main chip 2000 are omitted. The semiconductor packages 1000 and 1000a and the main chip 2000 may be mounted on the board substrate 3000 via third connection members 2600.

The board substrate 3000 may include a body layer 3100, an upper protection layer 3200, a lower protection layer 3300, upper pads 3400, and fourth connection members 3500. The body layer 3100 may include a plurality of wiring patterns. The upper and lower protection layers 3200 and 3300 protect the body layer 3100, and may be solder resist. As described above, the board substrate 3000 is often standardized and there is a limit in reducing the size thereof. A further description of the board substrate 3000 is omitted.

The third sealing member 5000 seals side and upper surfaces of the semiconductor packages 1000 and 1000a and the main chip 2000, and lower surfaces of the semiconductor packages 1000 and 1000a and the main chip 2000 may be bonded to an outer region of the board substrate 3000. The underfill 4000 fills a connection portion between the main chip 2000 and the board substrate 3000. In one embodiment, the underfill 400 is formed in the connection portion between the main chip 2000 and the board substrate 3000.

While the present disclosure has been particularly shown and described with reference to exemplary embodiments thereof, it will be understood that various changes in form and details may be made therein without departing from the spirit and scope of the following claims.

What is claimed is:

1. A semiconductor package comprising:
   a first chip that includes a chip region and scribe regions at edges of the chip region, wherein the chip region comprises integrated circuit units and main through substrate vias electrically connected to the integrated circuit units; and
   a second chip that is bonded onto the first chip,
   wherein the semiconductor package includes dummy conductive connectors including at least dummy wiring lines, the dummy conductive connectors electrically connected to the main through substrate vias at one end, and arranged to prevent an electrical connection at the other end.

2. The semiconductor package of claim 1, wherein the dummy wiring lines extend from the chip region of the first chip to the scribe regions.

3. The semiconductor package of claim 1, wherein the dummy wiring lines are surrounded by an intermetallic insulating layer in the first chip.

4. The semiconductor package of claim 1, wherein the first chip and the second chip are electrically connected through the main through substrate vias.

5. The semiconductor package of claim 1, wherein the dummy wiring lines terminate at side surfaces of the first chip.

6. The semiconductor package of claim 1, wherein the dummy conductive connectors further comprise dummy through substrate vias formed in the scribe regions of the first chip.

7. The semiconductor package of claim 6, wherein each dummy through substrate via is electrically connected to a main through substrate via through one of the dummy wiring lines.

8. The semiconductor package of claim 6, further comprising test pads that are formed in the scribe regions in the first chip and are electrically connected to the dummy through substrate vias.

9. The semiconductor package of claim 8, further comprising a molding member that covers the test pads and side surfaces of the second chip.

10. The semiconductor package of claim 8, wherein prior to the formation of the molding member, the test pads are configured to perform an electrical die sorting (EDS) test for detecting whether the connection between the second chip and the main through substrate vias is favorable or not.

11. A semiconductor package comprising:
    a first chip that comprises through substrate vias connected to circuitry in the first chip, and first connection members that are electrically connected to the through substrate vias;

a second chip that is stacked on the first chip and comprises second connection members that are electrically connected to the through substrate vias; and a sealing member that seals side surfaces of the first and second chip not to be exposed, wherein the first chip comprises dummy wiring lines that terminate at the side surfaces of the first chip and are electrically connected to the through substrate vias.

12. The semiconductor package of claim 11, wherein the first chip comprises:

a substrate having a first surface and a second surface;

a plurality of integrated circuit units on the first surface of the substrate;

an insulating interlayer that covers the integrated circuit units;

a plurality of multi-layer wiring patterns that are formed on the insulating interlayer and are connected to the main through substrate vias; and a lower insulating layer that covers the multi-layer wiring patterns, wherein the first connection members are formed on the lower insulating layer and are electrically connected to the multi-layer wiring patterns, and the dummy wiring lines are formed on the insulating interlayer.

13. A semiconductor package, comprising:

a first chip including through substrate vias electrically connected to circuitry within the first chip;

first external connection terminals electrically connected to the through substrate vias, respectively;

a second chip stacked on the first chip, the second chip including connection terminals electrically connected to the through substrate vias of the first chip; and a dummy conductive connector including at least a dummy wiring line, the dummy conductive connector including a first end electrically connected to the circuitry within the first chip and a second end left floating.

14. The semiconductor package of claim 13, further comprising an insulative capping layer that covers and contacts the dummy conductive connector.

15. The semiconductor package of claim 13, wherein the dummy conductive connector includes only the dummy wiring line.

16. The semiconductor package of claim 13, wherein the dummy wiring line terminates at the same plane as a first side of the first chip.

17. The semiconductor package of claim 13, wherein the dummy wiring line connects to an insulative capping layer.

18. The semiconductor package of claim 13, wherein the dummy conductive connector includes the dummy wiring line and at least a through substrate via electrically connected to the dummy wiring line.

19. The semiconductor package of claim 18, wherein the through substrate via is located in a scribe region of the first chip.

20. The semiconductor package of claim 18, wherein the dummy conductive connector further includes a dummy pad disposed on the through substrate via, the dummy pad contacting an insulative capping layer disposed around the second chip.

* * * * *